(12) United States Patent
Nan

(10) Patent No.: US 11,545,594 B2
(45) Date of Patent: Jan. 3, 2023

(54) DISPLAY PANEL AND DISPLAY DEVICE

(71) Applicant: Shanghai Tianma Micro-Electronics Co., Ltd., Shanghai (CN)

(72) Inventor: Yang Nan, Shanghai (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 218 days.

(21) Appl. No.: 16/910,684

(22) Filed: Jun. 24, 2020

(65) Prior Publication Data

US 2021/0305454 A1  Sep. 30, 2021

(30) Foreign Application Priority Data

Mar. 31, 2020  (CN) .......................... 202010244118.4

(51) Int. Cl.
*H01L 33/24* (2010.01)
*H01L 25/075* (2006.01)
*H01L 33/38* (2010.01)
*H01L 33/62* (2010.01)

(52) U.S. Cl.
CPC .......... *H01L 33/24* (2013.01); *H01L 25/0753* (2013.01); *H01L 33/382* (2013.01); *H01L 33/62* (2013.01)

(58) Field of Classification Search
CPC ... H01L 33/24; H01L 25/0753; H01L 33/382; H01L 33/62; H01L 25/167; H01L 27/156; H01L 27/124; H01L 27/1251
See application file for complete search history.

(56) References Cited

U.S. PATENT DOCUMENTS

| 10,985,187 | B1 * | 4/2021 | Nan | H01L 29/78696 |
| 2017/0179092 | A1 * | 6/2017 | Sasaki | H01L 25/167 |
| 2017/0278835 | A1 * | 9/2017 | Jeong | H01L 25/0753 |
| 2017/0358563 | A1 * | 12/2017 | Cho | H01L 33/20 |
| 2019/0319015 | A1 * | 10/2019 | Schuele | H01L 25/0753 |

FOREIGN PATENT DOCUMENTS

| CN | 202008566 U | 10/2011 |
| CN | 104483793 A | 4/2015 |
| CN | 106953011 A | 7/2017 |
| CN | 107104152 A | 8/2017 |
| CN | 107509284 A | 12/2017 |
| CN | 109613769 A | 4/2019 |
| CN | 109786421 A | 5/2019 |
| CN | 110471219 A | 11/2019 |

* cited by examiner

*Primary Examiner* — Su C Kim
(74) *Attorney, Agent, or Firm* — Anova Law Group, PLLC

(57) ABSTRACT

A display panel and a display device are provided in the present disclosure. The display panel includes a substrate and an array layer on the substrate, where the array layer includes a plurality of control units, one control unit includes a plurality of thin-film transistors, and the plurality of thin-film transistors in a same control unit is sequentially arranged along a ring-shaped path. The display panel further includes a plurality of light-emitting units on a side of the array layer away from the substrate. The plurality of light-emitting units and the plurality of control units are in a one-to-one correspondence. A light-emitting unit includes a plurality of light-emitting devices each having a first electrode. A plurality of first electrodes in a same light-emitting unit is sequentially arranged along an arrangement direction of the plurality of thin-film transistors in a control unit corresponding to the same light-emitting unit.

20 Claims, 20 Drawing Sheets

DISPLAY PANEL AND DISPLAY DEVICE

CROSS-REFERENCE TO RELATED APPLICATION

This application claims the priority of Chinese Patent Application No. 202010244118.4, filed on Mar. 31, 2020, the content of which is incorporated herein by reference in its entirety.

TECHNICAL FIELD

The present disclosure generally relates to the field of display technology and, more particularly, relates to a display panel and a display device.

BACKGROUND

Flat display devices have become the mainstream display devices because of their advantages of high image quality, low power consumption, thin body, and wide-range applications, thereby being widely used in various consumer electronics, such as mobile phones, TVs, personal digital assistants, digital cameras, notebook computers, desktop computers, and the like.

The micro light-emitting diode (micro-LED) display is a display which uses arrays with high-density micro-sized LEDs, which are integrated on a substrate, as individual pixels to display pictures. Similar to the large-sized outdoor LED display, each pixel can be addressed and driven separately for illumination. The pixel distance may be reduced from millimeter level to micrometer level, such that the micro-LED may be regarded as a reduced version of the outdoor LED display. The micro-LED display and the organic light-emitting diode (OLED) display both belong to the self-luminous display. However, compared with the OLED display, the micro-LED display has the advantages of enhanced material stability, longer lifespan, no image burn-in and the like, which has been considered to be the major competitor of the OLED display.

SUMMARY

One aspect of the present disclosure provides a display panel. The display panel includes a substrate and an array layer on the substrate, where the array layer includes a plurality of control units, one control unit includes a plurality of thin-film transistors, and the plurality of thin-film transistors in a same control unit is sequentially arranged along a ring-shaped path. The display panel further includes a plurality of light-emitting units on a side of the array layer away from the substrate. The plurality of light-emitting units and the plurality of control units are in a one-to-one correspondence. A light-emitting unit includes a plurality of light-emitting devices each having a first electrode. A plurality of first electrodes in a same light-emitting unit is sequentially arranged along an arrangement direction of the plurality of thin-film transistors in a control unit corresponding to the same light-emitting unit.

Another aspect of the present disclosure provides a display device including the above-mentioned display panel. The display panel includes a substrate and an array layer on the substrate, where the array layer includes a plurality of control units, one control unit includes a plurality of thin-film transistors, and the plurality of thin-film transistors in a same control unit is sequentially arranged along a ring-shaped path. The display panel further includes a plurality of light-emitting units on a side of the array layer away from the substrate. The plurality of light-emitting units and the plurality of control units are in a one-to-one correspondence. A light-emitting unit includes a plurality of light-emitting devices each having a first electrode. A plurality of first electrodes in a same light-emitting unit is sequentially arranged along an arrangement direction of the plurality of thin-film transistors in a control unit corresponding to the same light-emitting unit.

Other aspects of the present disclosure can be understood by those skilled in the art in light of the description, the claims, and the drawings of the present disclosure.

BRIEF DESCRIPTION OF THE DRAWINGS

Drawings incorporated in the specification and forming a part of the specification demonstrate the embodiments of the present disclosure and, together with the specification, describe the principles of the present disclosure.

DETAILED DESCRIPTION

Figure 1:
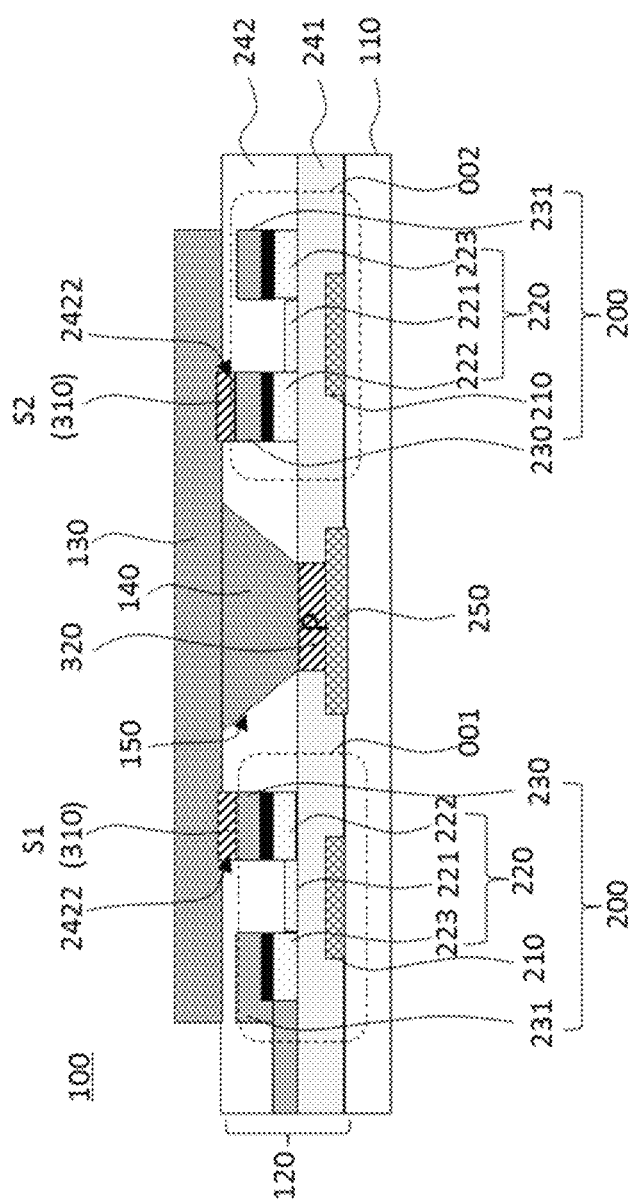
FIG. 1 illustrates a cross-sectional schematic of a display panel according to exemplary embodiments of the present disclosure.

In order to make the above-mentioned objects, features and advantages of the present disclosure more obvious and understandable, the present disclosure is further described with reference to the drawings and embodiments hereinafter.

It should be noted that specific details are set forth in the following description in order to fully understand the present disclosure. However, the present disclosure may be implemented in various other ways different from those described herein, and those skilled in the art may make similar promotion without violating the connotation of the present invention. Therefore, the present disclosure may not be limited by the following disclosed embodiments.

The terminology used in the embodiments of the present disclosure may be for the purpose of describing specific embodiments only and may not be intended to limit the present disclosure. The singular forms "a", "said" and "the" used in the embodiments of the present disclosure and the appended claims may be also intended to include the majority forms unless the context clearly indicates other meanings.

It should be noted that directional terms such as "upper", "lower", "left", and "right" described in the embodiments of the present disclosure may be described from the angle shown in the drawings, and should not be interpreted as the limitation to the embodiments of the present disclosure. Furthermore, in this context, it should also be understood that when an element is referred to as being formed "on" or "under" another element, it may not only be formed "on" or "under" another element directly, but also be indirectly formed "on" or "under" another element through an intermediate element.

Moreover, the exemplary embodiments may be implemented in various forms, and should not be construed as being limited to the embodiments set forth herein; on the contrary, providing the embodiments makes the present invention more comprehensive and complete, and fully conveys the concept of the exemplary embodiments to those skilled in the art. The same reference numerals in the drawings denote same or similar structures, and thus their repeated description may be omitted. The terms used to express the position and direction described in the present disclosure are illustrated using the drawings as examples. However, changes may be made as required and be included in the protection scope of the present invention. The drawings of the present disclosure may merely be used to illustrate the relative positional relationship. The layer thicknesses of certain parts are exaggeratedly drawn to facilitate understanding, and the layer thicknesses in the drawings do not represent the proportional relationship of the actual layer thicknesses. Furthermore, if there is no conflict, the embodiments of the present disclosure and the features in the embodiments may be combined with each other. The same reference numerals are used in the drawings of the embodiments of the present application, and the similarities of each embodiment may not be described in detail.

As shown in FIG. 1, FIG. 1 illustrates a cross-sectional schematic of a display panel according to exemplary embodiments of the present disclosure. The cross-section may be perpendicular to the plane where the display panel is located.

A display panel 100 may include a substrate 110, an array layer 120, and light-emitting devices, which are arranged sequentially.

For example, the substrate 110 may be made of a material including glass, polyimide (PI), polycarbonate (PC), polyethersulfone (PES), polyethylene terephthalate (PET), ethylene glycol ester (PEN), polyarylate (PAR), glass fiber reinforced plastic (FRP), or any other suitable polymer material(s). The substrate 110 may be transparent, translucent, or opaque.

The display panel 100 may further include the array layer 120 on the substrate 110. Optionally, the array layer 120 may include a pixel circuit and a drive circuit for controlling the light-emitting devices.

For example, the array layer 120 may further include a plurality of control units and one control unit may include a plurality of thin-film transistors 200. The thin-film transistors 200 in a same control unit may be arranged along a ring.

Optionally, the thin-film transistor 200 may constitute a part of the pixel circuit and be an essential part of the pixel circuit.

Optionally, the thin-film transistor 200 may include a gate electrode 210, an active layer 220, and a source/drain electrode.

Figure 2:
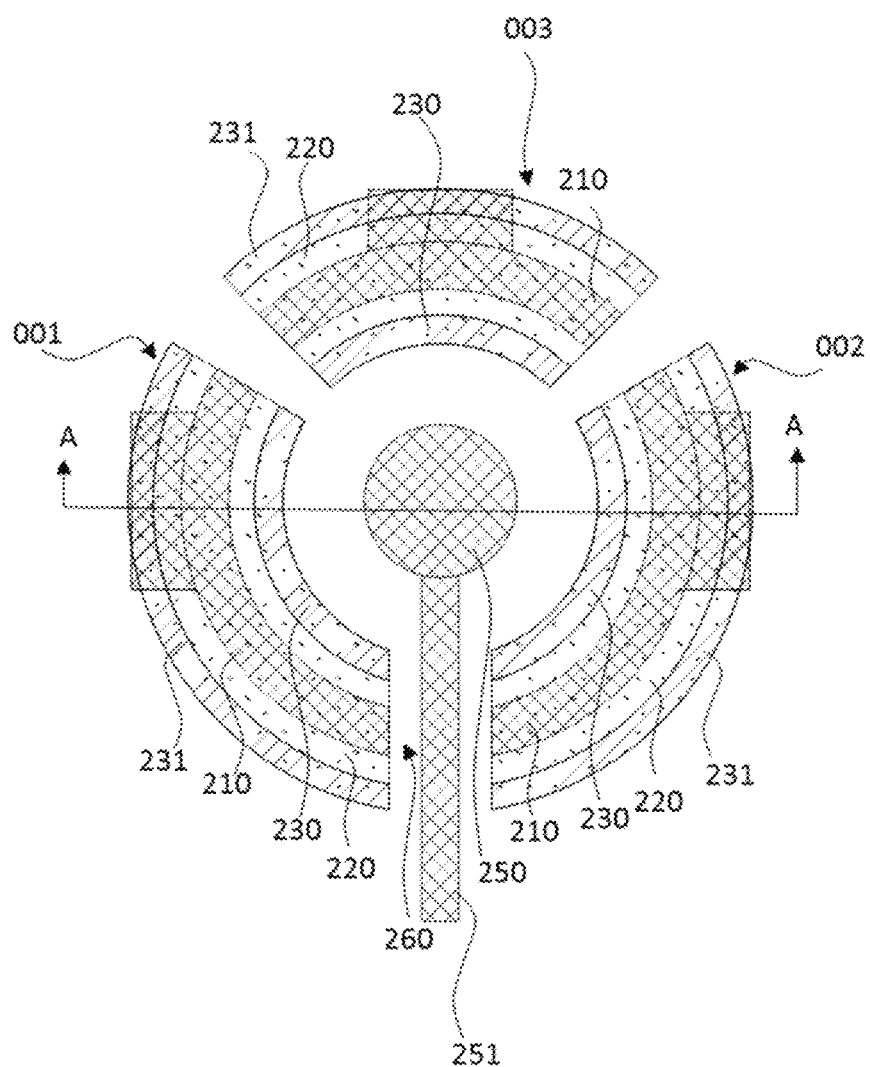
FIG. 2 illustrates a local top view of a control unit in a display panel according to exemplary embodiments of the present disclosure.
Figure 3:
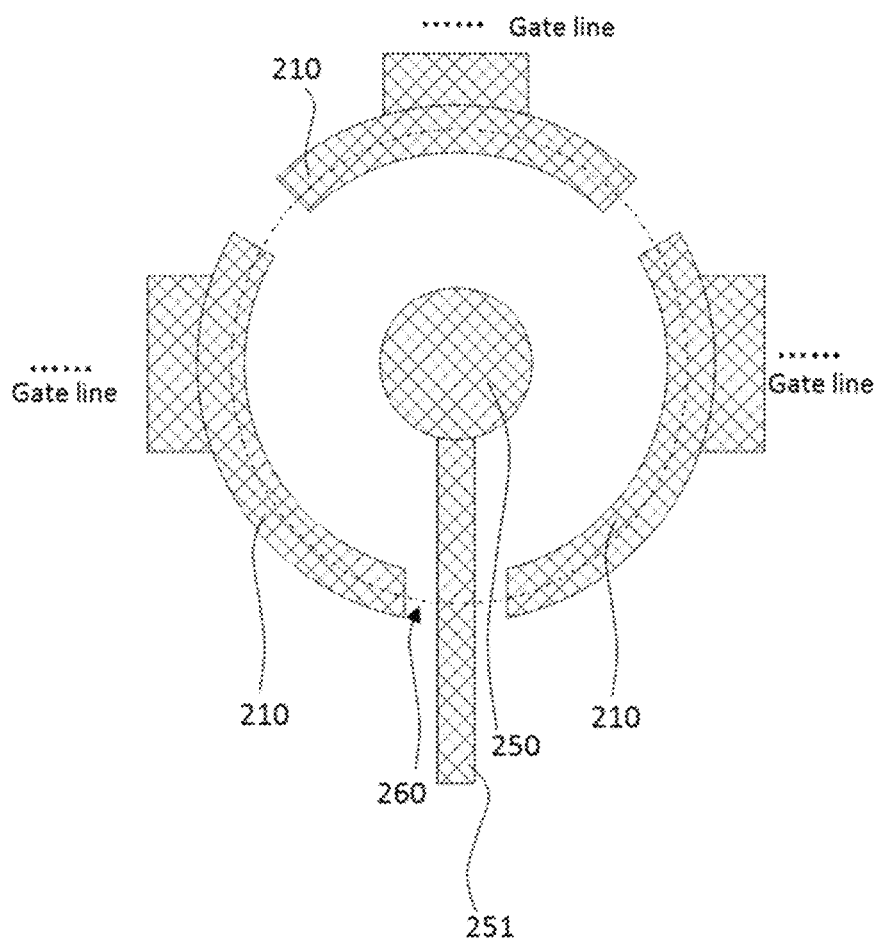
FIGS. 3-5 illustrate exploded schematics of the structure of the control unit in FIG. 2.
Figure 4:
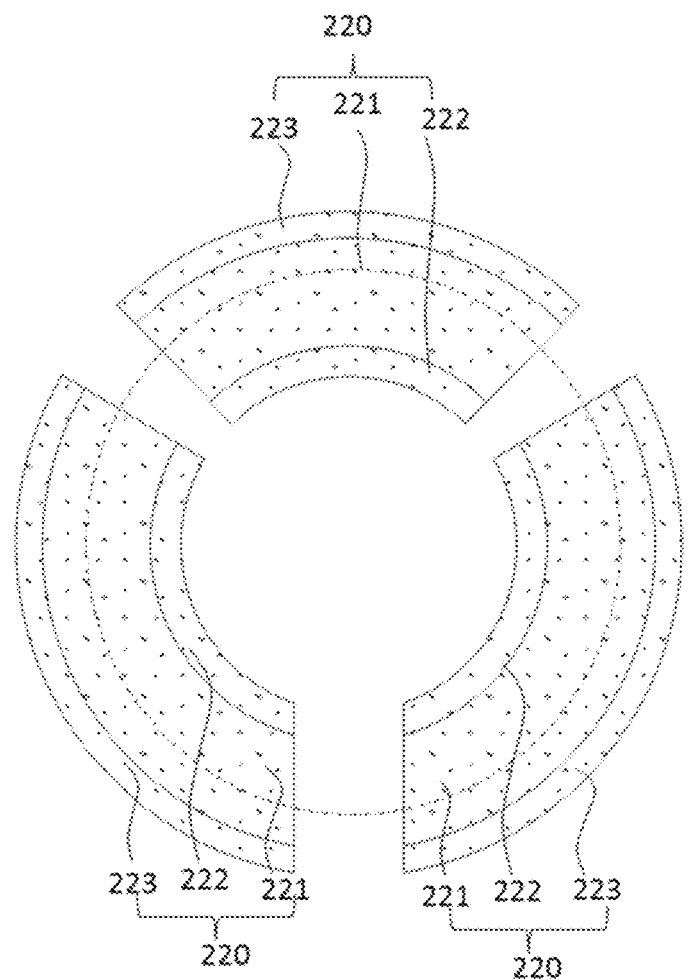
Figure 5:
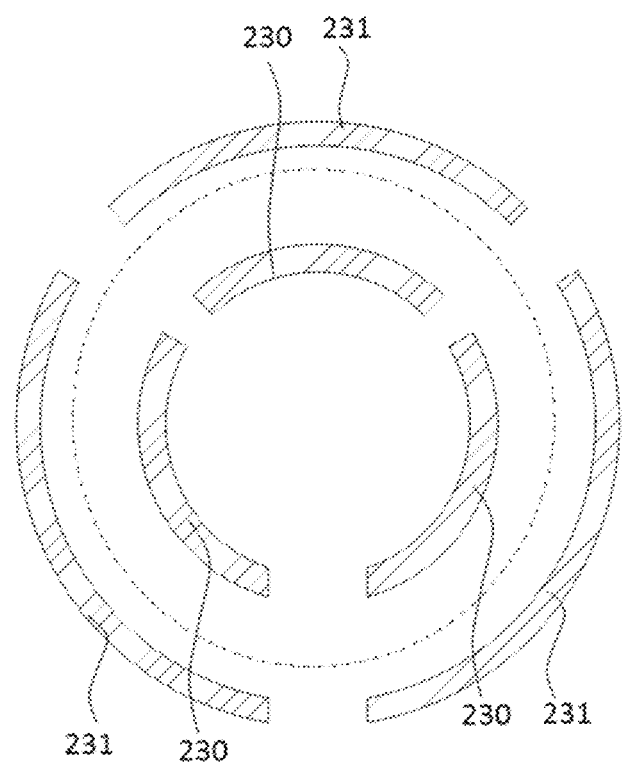

For example, referring to FIGS. 1-5, FIG. 2 illustrates a local top view of a control unit in a display panel according to exemplary embodiments of the present disclosure; and FIGS. 3-5 illustrate exploded schematics of the structure of the control unit in FIG. 2. FIG. 3 illustrates a local schematic of the film layer where the gate electrode of the thin-film transistor in the control unit is located; FIG. 4 illustrates a local schematic of the film layer where the active layer of the thin-film transistor in the control unit is located; and FIG. 5 illustrates a local schematic of the film layer where the source/drain electrode of the thin-film transistor in the control unit is located. The cross section of the control unit in FIG. 1 is equivalent to the cross section cutting along the AA direction in FIG. 2.

The bottom-gate thin-film transistor is used as example to describe the structure in the embodiments of the present disclosure.

The thin-film transistor 200 may include the gate electrode 210 on the substrate 110. Optionally, the gate electrode 210 may include a single layer or multiple layers of gold (Au), silver (Ag), copper (Cu), nickel (Ni), platinum (Pt), palladium (Pd), aluminum (Al), molybdenum (MO), or chromium (Cr), or may include aluminum (Al) neodymium (Nd) alloy and molybdenum (MO) tungsten (W) alloy.

The active layer 220 may be on the gate electrode 210. Optionally, the active layer 220 may be made of a material including an amorphous silicon material, a polysilicon material, a metal oxide material, or any other suitable material(s).

The active layer may include a channel region 221 which is a region overlapping with the gate electrode 210. For example, the orthographic projection of the channel region 221 on the substrate may overlap with the orthographic projection of the gate electrode 210 on the substrate 110.

Optionally, a first insulation layer 241 may be disposed between the gate electrode 210 and the active layer 220 to separate such two layers, thereby enabling such two layers to be insulatively overlapped with each other. Optionally, the first insulation layer 241 may include an inorganic layer including silicon oxide or silicon nitride and may include a single layer or multiple layers. Optionally, the first insulation layer 241 may be equivalent to the gate electrode insulation layer and may include a single layer or multiple layers.

A first end 230 may be located above the active layer 220, where the first end 230 may be one of the source electrode or the drain electrode of the thin-film transistor. Optionally, the first end 230 may be made of a metal material.

The thin-film transistors 200 in the same control unit may be arranged along a ring, that is, the thin-film transistors 200 in the same control unit may be sequentially arranged along a ring-shaped path. The arrangement path of the thin-film transistors may be arranged along the ring, that is, the orthographic projection of the arrangement path of the thin-film transistors on the substrate may be the ring shape surrounding a certain point of the substrate.

The ring shapes may include closed shapes and non-closed shapes; and the ring shape may include regular shapes and irregular shapes. It should be understood that the ring arrangement described hereinafter may be understood as being arranged sequentially along the above-mentioned ring-shaped path.

It should be understood that the dashed line in FIGS. 3-5 may represent the ring shape in one embodiment. However, the ring shape mentioned herein may not be a structure actually present in the display panel, but an approximate path shape in which certain structures in the present application may be arranged or extend.

It should be understood that the ring arrangement path may be the approximate arrangement path of the thin-film transistors, the thin-film transistors have widths, and the lines have no width. Therefore, it should be understood that the ring arrangement path may include multiple specific lines and the extension direction of such lines may be consistent with the approximate arrangement path. For example, the drain electrodes of the thin-film transistors may have an arrangement route, the active layers may have an arrangement route, and such routes may both belong to the ring arrangement path of the thin-film transistors. Therefore, routes and paths may have the same meaning in certain contexts in the following description.

It should be understood that the above-mentioned ring paths or routes may all have a common ring center, and the ring center may be the center, the geometric center, and the gravity center of the ring shape.

For example, the orthographic projections of the gate electrodes 210 of the thin-film transistors 200 in the same control unit on the substrate 110 may be arranged along the ring-shaped path. Optionally, the orthographic projection of the gate electrode 210 of each thin-film transistor 200 formed on the substrate 110 may extend along the ring-shaped path.

For example, all active layers 220 in the same control unit may also be arranged along the ring. That is, the active layers 220 may be arranged along the ring-shaped path, and the channel regions 221 may also form the ring-shaped arrangement along the extension path of the active layers 220.

The projections of the channel regions 221 may form the ring-shaped arrangement along the path of the projections of the gate electrodes 210, and the above-mentioned ring shape may be a similar or congruent ring shape where the centers or gravity centers of the orthographic projections on the substrate may coincide with each other. Taking the circular ring shape as an example, the ring centers of the above-mentioned ring-shaped projections may coincide with each other.

Furthermore, the length direction of the channel region 221 of the thin-film transistor 200 may extend along the ring arrangement path of the active layers 220.

Similarly, all first ends 230 in the same control unit may also be arranged sequentially along the ring, which may not be described in detail herein. In such way, the thin-film transistors 200 in the same control unit may collectively form a ring-shaped control unit shown in FIG. 2. Obviously, the ring shape may be an unclosed ring shape with an opening, and the opening may be the spacing between the thin-film transistors in the control unit. For example, the control unit may include three thin-film transistors in one embodiment, which may respectively be a first thin-film transistor 001, a second thin-film transistor 002, and a third thin-film transistor 003. The first thin-film transistor 001, the second thin-film transistor 002, and the third thin-film transistor 003 may be arranged around a certain point collectively to form the ring-shaped control unit.

Optionally, the array layer 120 may further include a second insulation layer 242 covering the thin-film transistor 200.

Optionally, the second insulation layer 242 may be a planarization layer, including organic layers such as acrylic, polyimide (PI), benzocyclobutene (BCB), and the like, which may have a planarization effect. Or, optionally, the second insulation layer 242 may be a passivation layer, which may be formed of an inorganic layer including silicon oxide, silicon nitride and the like, or an organic layer.

Furthermore, the display panel 100 may further include light-emitting units 130 on the side of the array layer 120 away from the substrate 110. The light-emitting units 130 and the control units may be in a one-to-one correspondence, that is, one above-mentioned control unit may control the display of one light-emitting unit 130. The light-emitting unit 130 may include a plurality of light-emitting devices.

Optionally, the light-emitting device may be a micro-LED or a mini-LED.

Figure 6:
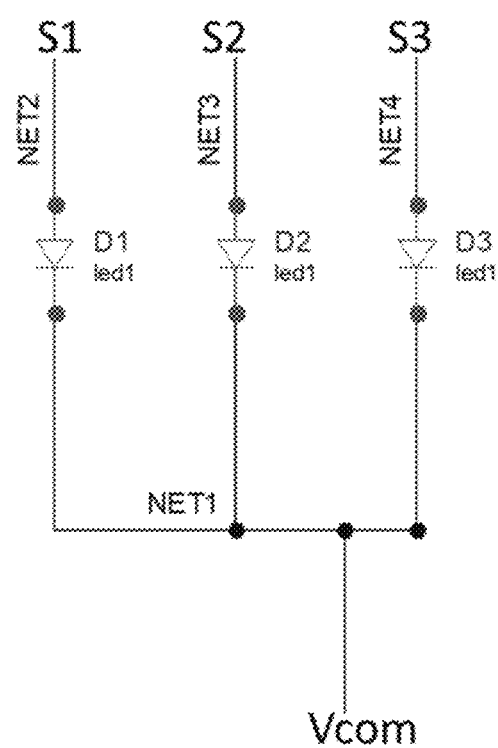
FIG. 6 illustrates a circuit diagram of a light-emitting unit according to exemplary embodiments of the present disclosure.

For example, referring to FIG. 1 and FIG. 6, FIG. 6 illustrates a circuit diagram of the light-emitting unit 130 according to exemplary embodiments of the present disclosure.

Optionally, the light-emitting devices of the same light-emitting unit 130 may have different colors. In one embodiment, one light-emitting unit 130 may include the light-emitting devices of three different colors: a first light-emitting device D1, a second light-emitting device D2, and a third light-emitting device D3. Optionally, the light-emitting devices of three different colors respectively emit light of three colors including red, green, and blue.

The light-emitting device may include a first electrode 310 which may be one of the anode (or N terminal, positive terminal) or cathode (or P terminal, negative terminal) of the light-emitting device fabricated with LED. The N terminal may be used as the example of the first electrode 310 in one embodiment. Optionally, the first electrode may be made of a metal material.

The first electrodes 310 in the same light-emitting unit 130 may be sequentially arranged along the arrangement direction of the thin-film transistors 200 in the corresponding control unit. That is, the first electrodes 310 in the same light-emitting unit 130 may be sequentially arranged along the ring, and the first electrodes 310 of the light-emitting devices of different colors may be electrically connected to different thin-film transistors 200 in the corresponding control unit. In other words, the arrangement paths of the first electrodes and the first ends may be same, and the ring shapes formed by such two paths may be identical. Optionally, the first electrodes 310 in the same light-emitting unit 130 may be sequentially arranged along the thin-film transistors 200 in the corresponding control unit in the one-to-one correspondence. That is, the orthographic projections of the first electrodes and the first ends may coincide with each other.

Optionally, the first electrode 310 may correspond and be connected to the first end 230 through an opening 2422 on the second insulation layer 242.

That is, in a combination of a corresponding set of the control unit and the light-emitting unit 130, the first electrodes and the first ends of the thin-film transistors may be electrically connected in the one-to-one correspondence. For example, the first electrode 310 of the first light-emitting device D1 may be connected to the first thin-film transistor 001 (S1) accordingly; and the first electrode 310 of the second light-emitting device D2 may be connected to the second thin-film transistor 002 (S2) accordingly. Similarly, the third light-emitting device D3 and the fourth light-emitting device D4 may not be described in detail herein.

Figure 7:
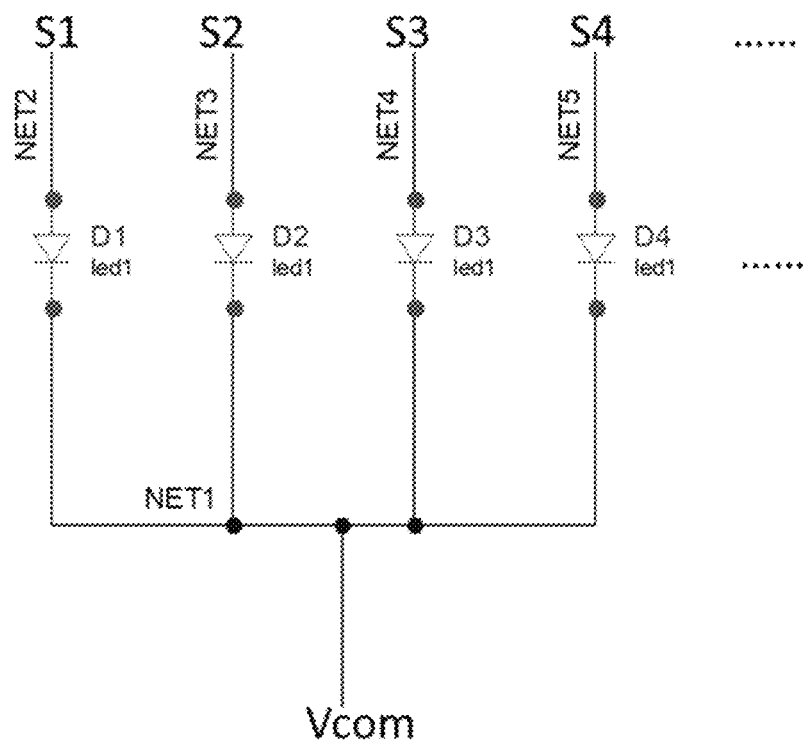
FIG. 7 illustrates a circuit diagram of another light-emitting unit according to exemplary embodiments of the present disclosure.

Obviously, in other optional embodiments of the present application, the quantity of the thin-film transistors and light-emitting devices may be other quantities as required. For example, as shown in FIG. 7, FIG. 7 illustrates a circuit diagram of another light-emitting unit according to exemplary embodiments of the present disclosure. One light-emitting unit 130 may include the light-emitting devices of four different colors: the first light-emitting device D1, the second light-emitting device D2, the third light-emitting device D3, and a fourth light-emitting device D4. The four light-emitting devices respectively emit light of four colors including red, green, blue, and white. The quantity of the thin-film transistors in the control unit may also need to be matched with the quantity of the light-emitting devices accordingly.

Optionally, the light-emitting unit 130 may be a composite micro-LED.

One light-emitting unit 130 may be the smallest working unit, that is, the smallest unit aligned with the array layer. The light-emitting devices in each light-emitting unit 130 may collectively be formed on a composite LED chip and encapsulated in the composite LED chip by an encapsulation layer, and then be transported collectively to the display panel. The encapsulated anode of all LED tubes (e.g., the light-emitting devices) may be individually led out, and the electrode pad outside the encapsulation layer may correspond to the reserved contact electrode on the TFT source terminal, that is, the first electrodes 310 of the light-emitting devices exposed outside the encapsulation layer may be formed respectively. Each light-emitting unit 130 may emit light of different colors according to the brightness combination of the light-emitting devices of different colors in the light-emitting unit 130. Each light-emitting unit 130 and the control unit may collectively constitute a pixel unit, and a plurality of pixel units may collectively display the pictures.

Optionally, the composite micro-LED (e.g., the multiple LED encapsulation) in one embodiment may be formed by transporting fabricated monochromatic LED chips on a same encapsulation substrate and integrally encapsulating the LED chips after the connections are completed. The internal structure of the composite LED chip may only be electrically connected to the electrodes exposed outside the encapsulation layer, but it does not necessarily need to be overlapped or it is not required to set the spatial position correspondingly. The LEDs (the light-emitting devices) inside the encapsulation layer may be the structures of front-mounted, flip-chip, vertical and the like, and the electrodes may be led to the encapsulated electrodes by the wiring. The encapsulated electrodes may be located directly at the bottom and correspond to the solder balls and may also be pads at the bottom pads or on the upper and lower sides.

Optionally, the shape (referring to the shape of the orthographic projection on the substrate) and size of the first electrode corresponding to the thin-film transistor may be consistent with the shape (referring to the shape of the orthographic projection on the substrate) and the size of the first end of the thin-film transistor.

Optionally, the diameter of the first electrode 310 of the light-emitting device may be consistent with the diameter of the first end 230 of the corresponding thin-film transistor 200. For example, when the first electrodes and the first ends are arranged along a ring, the first electrodes and the first ends are congruent, the centers of the corresponding rings may overlap with each other, and the central angles may be equal to each other. In such way, the two orthographic projections of the first electrodes and the first ends may coincide with each other. Obviously, even if the first ends and the first electrode are not completely equal to each other or not coincident with each other, the following may be still satisfied: the orthographic projection of one of the first end and the first electrode on the substrate may extend along the path of orthographic projection of the other one of the first end and the first electrode.

Optionally, the display panel 100 may further include a buffer layer (not shown) which is located between the array layer 120 and the substrate 110. Optionally, the buffer layer may include a stacked structure with multiple inorganic and organic layers, which may block oxygen and moisture and may prevent the diffusion of moisture or impurities through the substrate. The buffer layer may provide a flat surface on the upper surface of the substrate, and the structure of the buffer layer in the present disclosure may not be described in detail.

Optionally, the display panel 100 may be divided into a display region and a non-display region surrounding the display region. It should be understood that the display region is the region for displaying pictures on the display panel and includes a plurality of pixels arranged in an array. One pixel may include light-emitting devices and thin-film transistors 200 corresponding to the light-emitting devices. The non-display region may surround the display region and include peripheral drive elements, peripheral wiring, and a fan-out region.

In one embodiment, the shapes of the first electrode of the light-emitting device and the first end of the thin-film transistor may be substantially identical, and the light-emitting device may overlap with the thin-film transistor, which may reduce the space occupied by the pixel composed of a group of light-emitting devices and thin-film transistors corresponding to the light-emitting devices, thereby improving the display resolution since more pixels are disposed for the display panel with a same area. The space occupied by the pixel composed of a group of light-emitting devices and thin-film transistors corresponding to the light-emitting devices may be reduced, and more pixels may be disposed for the display panel with a same area.

Furthermore, in one embodiment, one alignment operation (i.e., the alignment of one light-emitting unit and on control unit) may directly complete the alignment of multiple light-emitting devices and thin-film transistors, which may improve the alignment efficiency and alignment accuracy.

Moreover, the distance between the thin-film transistor in the same control unit and the light-emitting device in the same light-emitting unit may be reduced, which may not need to be limited by the transport process. Therefore, it is beneficial for the display effect of the pixels and the color mixing between the pixels; the alignment difficulty in the pixel units may be avoided; and the display resolution and transport efficiency may be improved.

In addition, the thin-film transistors in the same control unit may be aggregated and arranged in the ring arrangement manner, which may avoid interference to other control units, control the cross-talk between the thin-film transistors in the same control unit to be consistent, and avoid the cross-talk of the sandwiched thin-film transistors to be different from the cross-talk of the thin-film transistors at the edges in a straight line arrangement.

Furthermore, the second insulation layer 242 may include the opening 2422 exposing the first end 230. Optionally, the opening 2422 may correspond to the shape and size of the first end 230, that is, the plurality of openings 2422 may also be arranged along the ring-shaped path and may coincide with all first ends 230 in a one-to-one correspondence.

Furthermore, the active layer 220 may further include first contact regions 222 arranged in a ring shape. Optionally, the first contact region 222 may be one of the source contact region and the drain contact region of the active layer 220. The source contact region and the drain contact region may be formed by doping N-type impurity ions or P-type impurity ions, and the channel region 221 may be between the source contact region and the drain contact region.

For example, the channel region 221 may surround the first contact region 222, and the first end 230 may overlap and contact the first contact region 222. That is, the plurality of channel regions may be sequentially arranged along the ring. The active layer may further include the plurality of first contact regions arranged along the inner side of the ring shape of the channel regions which are arranged along the ring, and the first ends may overlap and contact the first contact regions.

Optionally, the thin-film transistor 200 may further include a ring-shaped second end 231. The second end 231 may be the other one of the source electrode or the drain electrode, that is, the second end 231 may be one of the source electrode or the drain electrode which is different from the first end 230. The plurality of second ends 231 may collectively form a non-closed ring surrounding the first ends 230. Optionally, the second ends 231 and the first ends 230 may be in a same layer with a same material.

The active layer 220 may further include second contact regions 223 arranged in the ring shape, and the second contact regions 223 may surround the channel regions 221. The second contact region 223 may form the other one of the source contact region and the drain contact region of the active layer 220 which is different from the first contact region 222. That is, all the second contact regions 223 in the same control unit may collectively form a non-closed ring surrounding the channel regions 221 and the first contact regions 222. In other words, the first ends may be connected to the region of the active layer adjacent to the inner side of the ring shape.

The second ends 231 may overlap and contact the second contact regions 223 accordingly.

In one embodiment, the second contact regions 223 may be sequentially arranged by surrounding the channel regions 221 and the first contact regions 222, the first ends 230 may overlap and contact the first contact regions 222, and the first electrodes of the light-emitting devices may be connected to the first ends accordingly. Therefore, it is equivalent to that the first electrodes of the light-emitting devices may be connected to the inner ring of the thin-film transistors. In such way, it may avoid that the first electrodes of the light-emitting devices needs to cross the channel regions of the active layer, and the electrodes of the light-emitting devices excessively overlap with the channel regions of the thin-film transistors, which may affect the electrical performance of the devices, such as generating coupling. Furthermore, the connection of the light-emitting device to the electrode (e.g., the first end 230) at the inner ring of the thin-film transistor may be beneficial for the another electrode (e.g., the outer ring electrode, the second end 231) of the thin-film transistor to be connected to other structures outside the thin-film transistor to avoid wiring.

Furthermore, since the light-emitting device is the LED which emits light in multiple directions, that is, the LED may emit light in various directions, and the electrical performance of the channel region of the active layer may be affected by the illumination. Therefore, in one embodiment, the overlapping of the light-emitting device and the channel region of the active layer may be avoided, which may not only satisfy the overlapping of the TFT and LED and improve the distribution density of the in-plane LED to increase the display resolution, but also avoid the influence of the light-emitting device on the electrical performance of the thin-film transistor, thereby improving the display performance of the display panel.

It should be understood that the certain structure mentioned above is arranged along the ring may refer to that the shape of the orthographic projection of the structure on the plane of the display panel may be arranged along the ring.

It should be understood that two sides of the ring shape refer to the inner side and outer side of the ring shape, that is, the ring shape includes two contours (or edges forming the pattern). The outer edge surrounds the inner edge, the inner side of the ring shape refers to the side adjacent to the inner edge of the ring shape, and the outer side of the ring shape refers to the side adjacent to the outer edge of the ring shape.

It should be understood that a certain film layer in one embodiment is "on" a certain film layer, which may be understood as being located "on a side adjacent to the substrate". Whether the two film layers are in contact with each other may refer to the definition of the positional relationship between the two film layers in the present application.

It should be understood that the "corresponding" in the "corresponding" arrangement of the two ring structures in the present application may refer to that the two ring shapes are arranged using a same point as the ring center, thereby forming a nested or overlapped structure. For example, "correspond and be connected to" in the above-mentioned "the first electrode 310 may correspond and be connected to the first end 230" may indicate that the projections of the ring-shaped first electrode and the ring-shaped first end are overlapped with each other, or the geometric centers of two ring shapes are overlapped with each other. For example, when the first electrode and the first end are circular ring shapes, the first electrode and the first end are congruent and the circular ring shapes are overlapped with each other, such that the orthographic projections of first electrode and the first end on the substrate may be exactly overlapped with each other. Obviously, even if the first end and the first electrode are not completely equal to each other or not coincident with each other, the following may be still satisfied: the orthographic projection of one of the first end and the first electrode on the substrate may extend along the path of orthographic projection of the other one of the first end and the first electrode.

In the above-mentioned embodiments, a bottom-gate thin-film transistor is used an example to describe the structure. Obviously, the thin-film transistor may also be a top-gate thin-film transistor in other embodiments of the present disclosure, which may not be described in detail at the present application.

Based on any one of the above-mentioned embodiments and in conjunction with the drawings of any one of the above-mentioned embodiments, the light-emitting device may further include a second electrode 320. The second electrode 320 and the first electrode 310 may be at a same side of the light-emitting device.

For example, the light-emitting device may include two opposite ends, and the first electrode 310 and the second electrode 320 may be at a same side of the light-emitting device. Optionally, the light-emitting device may include an end facing toward the substrate 110 and an end facing away from the substrate 110; the first electrode 310 and the second electrode 320 may both on the ends of the light-emitting device facing toward the substrate 110.

The second electrode 320 may be the other one of the anode (or N terminal, positive terminal) or cathode (or P terminal, negative terminal) of the light-emitting device formed with LED, which is different from the first electrode 310. The P terminal may be used as the example of the second electrode 320 for description in one embodiment.

Optionally, the light-emitting devices in the same light-emitting unit 130 may share the second electrode 320. All of the first electrodes 310 may be sequentially arranged according to the path surrounding the second electrode 320. Optionally, the second electrode 320 may be at the ring center of the ring-shaped first electrodes 310. Optionally, the outer contour of the second electrode 320 may be consistent with the shape arrangement path of the first electrodes 310, but the size of the outer contour of the second electrode 320 may be less than the size of the ring-shaped path, such that all first electrodes 310 and the second electrode 320 may be matched with each other suitably.

Furthermore, the array layer 120 may further include a common electrode 250. In the same control unit, the thin-film transistors may be arranged by surrounding the common electrode.

For example, the first ends 230 may be arranged by surrounding the common electrode 250. Optionally, the common electrode 250 may coincide with the ring center of the ring-shaped control unit. Optionally, the outer contour of the common electrode 250 may be consistent with the shape of the ring, but the size of the outer contour of the common electrode 250 may be less than the size of the ring, such that the common electrode 250 may be suitably matched with the thin-film transistors and the light-emitting devices. It should be noted that the common electrode surrounded by the thin-film transistors may be the common electrode corresponding to the light-emitting unit where the second electrode corresponding to the thin-film transistors is located.

Furthermore, the common electrode 250 and the second electrode may be electrically connected with each other.

In one embodiment, the ring-shaped first electrode is nested with the second electrode, such that the alignment of the two electrodes may not disturb each other, and the second electrode and the first electrode may be more accurately aligned with the first end and the common electrode respectively.

Furthermore, the array layer 120 may further include a common electrode line 251 disposed in a same layer as the common electrode 250. The common electrode 250 and the gate electrode 210 may be made of a same material in a same layer. That is, the common electrode, the common electrode line, and the gate electrode may be in a same layer and made of a same material in a same fabrication process.

Optionally, the common electrode line 251 may be electrically connected to the common electrode 250 through a spacing 260 between the thin-film transistors 200. That is, the spacing between the thin-film transistors arranged in the ring shape in one embodiment may provide a path for the common electrode line to pass through.

Optionally, the common electrode line may be used to transmit a cathode signal for the common electrode.

Optionally, the display panel may further include a signal source such as a control chip IC. The common electrode line may be connected between the common electrode and the control chip. The common electrode line may pass a first spacing to implement the connection with the common electrode.

In one embodiment, the common electrode and the gate electrode are in a same layer, which may implement the overlapped arrangement of the thin-film transistor and the light-emitting device to reduce the occupied space; meanwhile, with the help of the design of the first spacing, the normal work of the devices may be achieved, and the fabrication process and the quantity of the film layers may be reduced, thereby reducing the cost and simplifying the process.

Figure 8:
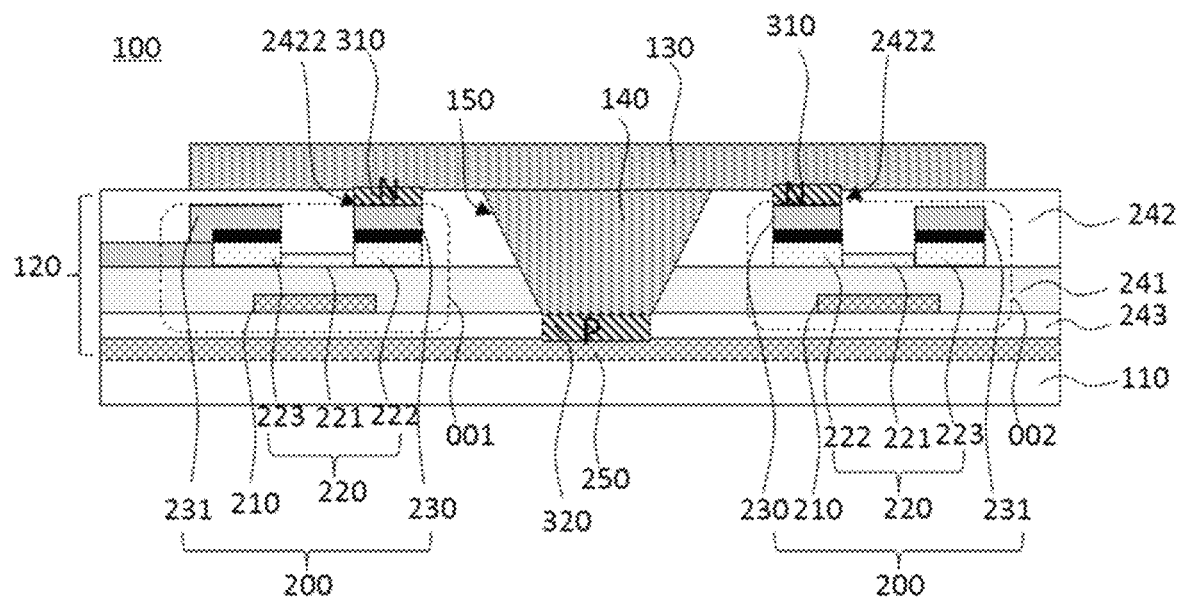
FIG. 8 illustrates a cross-sectional schematic of another display panel according to exemplary embodiments of the present disclosure.

In other optional embodiments of the present application, as shown in FIG. 8, FIG. 8 illustrates a cross-sectional schematic of another display panel according to exemplary embodiments of the present disclosure. Unlike the above-mentioned embodiments, the common electrode 250 may be located between the thin-film transistor 200 and the substrate 110. For example, a third insulation layer 243 may be disposed between the common electrode 250 and the thin-film transistor 200.

Optionally, the common electrode 250 may be an integrally formed full surface structure, that is, the projection of the common electrode 250 on the substrate 110 may cover at least two or more pixels.

Optionally, the common electrode may be a complete planar electrode covering entire display region.

Optionally, the common electrode 250 may be connected to a fixing point.

Optionally, the common electrode 250 may include a reflective material.

In the embodiment, while taking into account the reduction of the space occupied by the TFT and the light-emitting device and also the resolution improvement, disposing the common electrode between the thin-film transistor and the substrate may ensure the integrity of the ring-shaped thin-film transistors, enable the gate electrodes to be a closed-loop ring, and ensure the electrical performance of the TFT in each region of the ring to be consistent with each other.

Moreover, the full surface common electrode may enable the structure of the display panel to be more stable and ensure the uniformity of the surface. In addition, the common electrode may be multiplexed as an electrostatic shielding layer which may implement electrostatic protection, and the common electrode may also be used as a reflective layer. In one embodiment, the common electrode may be plated on the entire surface without using mask, which may simplify the fabrication process.

Figure 9:
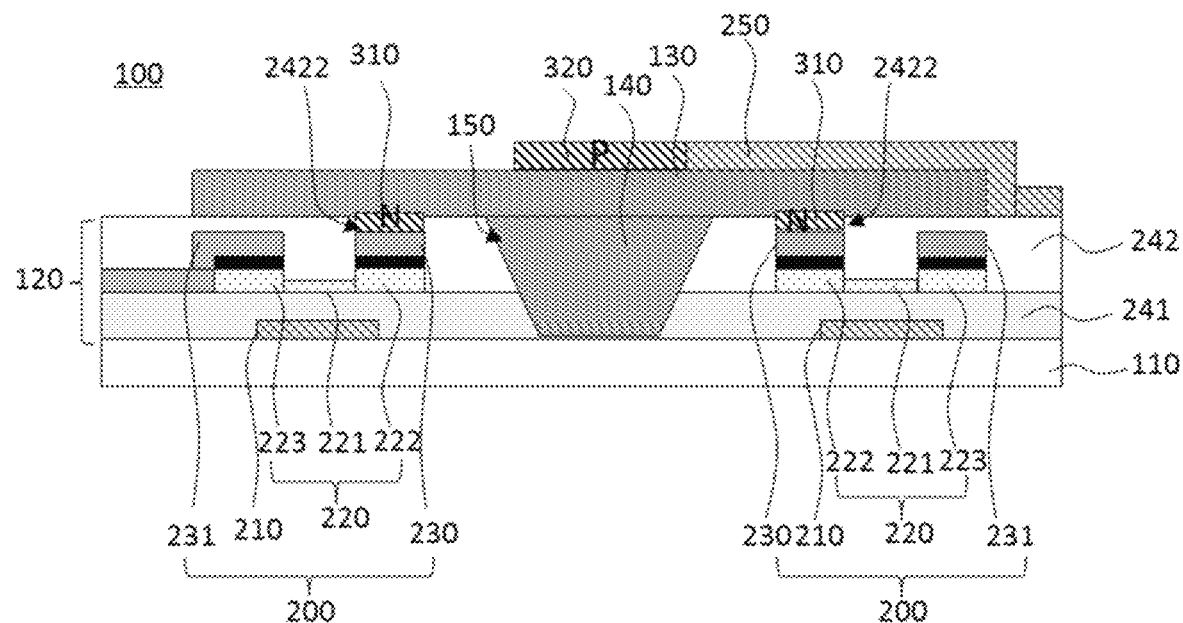
FIG. 9 illustrates a cross-sectional schematic of another display panel according to exemplary embodiments of the present disclosure.

In other optional embodiments of the present application, as shown in FIG. 9, FIG. 9 illustrates a cross-sectional schematic of another display panel according to exemplary embodiments of the present disclosure. Unlike the above-mentioned embodiments, the light-emitting unit may include the second electrode 320; and the second electrode 320 and the first electrode 310 may be on different sides of the light-emitting unit. For example, the light-emitting unit may include two opposite ends; the first electrode 310 may be at one end of the light-emitting unit facing toward the substrate 110, and the second electrode 320 may be at the other end of the light-emitting unit facing away from the substrate 110.

Optionally, the orthographic projections of the first electrodes on the substrate may still be sequentially arranged by surrounding the orthographic projection of the second electrode on the substrate.

By disposing a top electrode (e.g., the design in which the ring-shaped thin-film transistors and the first electrodes are combined with the common electrode on the top of the LED) in one embodiment, the problem of excessive electrode contact resistance caused by the via etching process fluctuation may be avoided, which may reduce the requirement for the etching process. Moreover, under the premise that the transmittance and brightness are satisfied, the top electrode connection method may use the full surface plating film (the transparent conductive film such as ITO and the like) as the common electrode without etching.

Referring to FIG. 1, FIG. 8 or FIG. 9, the light-emitting device may further include a protrusion 140 protruding toward the substrate 110. That is, the protrusion may be at the center (the geometric center) of the ring. Taking the circular ring as an example, the protrusion may be at the ring center of the circular ring. A certain point in the above-mentioned description that the ring-shaped arrangement is formed by surrounding the certain point may be the protrusion in one embodiment.

Furthermore, the insulation layer in the array layer 120 may include a trench 150 accommodating the protrusion 140. The ring may surround the trench 150, that is, the ring-shaped control unit may surround the trench 150. In other words, the light-emitting unit may include the protrusion protruding toward the substrate; the first electrodes may surround the protrusion; the insulation layer in the array layer may include the trench accommodating the protrusion; and the thin-film transistors may surround the trench.

The protrusion 140 and the trench 150 may be matched with each other. It should be noted that "match" may refer to that the contour of the protrusion 140 may be consistent with the contour of the trench 150, and the protrusion may fit into the trench suitably. In addition, after the protrusion and the trench are attached together, the protrusion may not rotate relative to the trench. The "rotation" mentioned herein may refer to the rotation of the protrusion using the axis, which may pass through the center of the above-mentioned ring and be perpendicular to the substrate, as the rotation axis.

Figure 10:
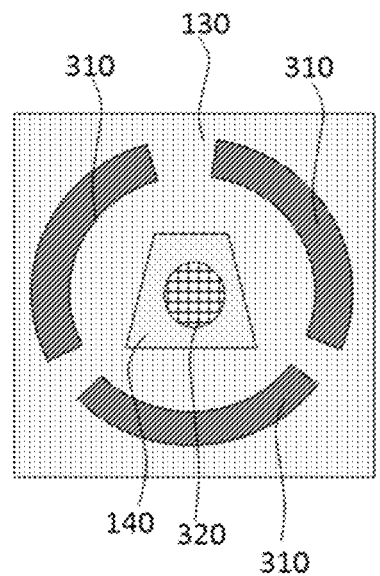
FIG. 10 illustrates a top view of a light-emitting unit of a display panel according to exemplary embodiments of the present disclosure.

Optionally, the protrusion 140 may be a non-rotatable body. For example, as shown in FIG. 10, FIG. 10 illustrates a top view of a light-emitting unit of a display panel according to exemplary embodiments of the present disclosure. The top view is equivalent to the orthographic projection schematic of the light-emitting unit on the substrate, and only certain important components are shown in FIG. 10 for the convenience of description.

Optionally, the orthographic projection of the protrusion 140 on the substrate may be trapezoidal.

Figure 11:
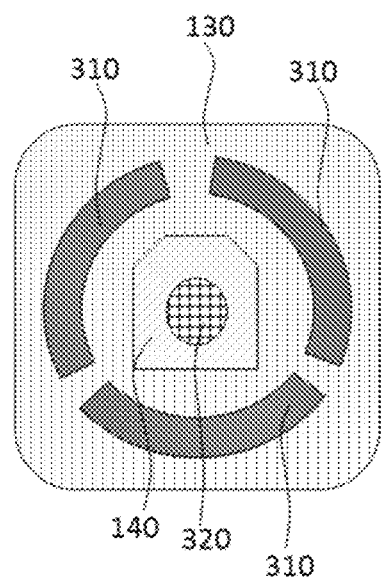
FIG. 11 illustrates a top view of a light-emitting unit of another display panel according to exemplary embodiments of the present disclosure.

In other optional embodiments of the present application, as shown in FIG. 11, FIG. 11 illustrates a top view of a light-emitting unit of another display panel according to exemplary embodiments of the present disclosure. Optionally, the orthographic projection of the protrusion 140 on the substrate 110 may be a quadrilateral shape with at least two different chamfers. It should be noted that the case where two corners are chamfered and non-chamfered respectively in the present application may also belong to the case where two angles have different chamfers.

Obviously, in other optional embodiments of the present application, optionally, the orthographic projection of the protrusion on the substrate may be an asymmetric shape.

In one embodiment, on the one hand, since the protrusion is embedded in the trench, the light-emitting device may be more stably arranged on the array layer through the nested structure, which may improve the structural stability of the display panel; and the match between the protrusion and the trench may prevent the protrusion from rotating relative to the trench, which may ensure that each first electrode correctly contacts the corresponding thin-film transistor. On the other hand, the misalignment risk may be reduced, and one alignment of the protrusion and the trench may connect multiple light-emitting devices (e.g., three light-emitting devices in one embodiment) accordingly. Multiple light-emitting devices may only need one protrusion. When the light-emitting devices are arranged on the array layer, only the light-emitting devices with protrusions correctly entering into the trenches may be fixed on the array layer since the trenches are on the array layer and the protrusions are disposed on the light-emitting devices. In such way, the automatic assembly of the light-emitting devices may be implemented, there may not be required to align the light-emitting devices through the grabbing and alignment equipment, and also the alignment error may not occur due to the limited transport arrangement precision. Especially for the high-resolution display requirement, it may not only save the space occupied by the alignment mark, but also reduce the fabrication process and the precision requirement of the alignment process for fabricating the high-density light-emitting devices.

Referring to FIG. 1 or FIG. 8, unlike other embodiments, the protrusion 140 may be at the ring center of the ring-shaped first electrode. For example, in one embodiment, the ring center of the overall contour of the pattern surrounded by all first electrodes 310 in one light-emitting unit 130 may coincide with the geometric center of the light-emitting unit 130.

The insulation layer in the array layer 120 may include the trench 150 exposing the common electrode 250. For example, all insulation layers on the common electrode 250 may collectively form the trench 150. For example, the first insulation layer 241 and the second insulation layer 242 in FIG. 1 may collectively form the trench 150.

The protrusion 140 may be matched with the trench 150, that is, the protrusion 140 may be embedded in the trench 150 to enable the common electrode 250 to be in contact with the second electrode 320, thereby implementing the electrical connection between the common electrode 250 and the second electrode 320.

The second electrode 320 may be on the protrusion 140. It should be noted that the meaning of "on" is different from that in the above-mentioned embodiment, and "the second electrode 320 may be on the protrusion 140" herein may indicate that the second electrode 320 may be on the side surface of the protrusion 140 away from the light-emitting device.

In one embodiment, the second electrode and the first electrodes may be disposed along the ring-shaped arrangement with a consistent pattern; the first electrodes and the second electrode may collectively form a surrounding circle that the plurality of first electrodes surround the second electrode; all thin-film transistors in the control unit may be arranged by surrounding the common electrode; the protrusion where the second electrode is located may be matched with the trench exposing the common electrode, and the above-mentioned features may be combined to cooperate with each other. On the one hand, the accurate alignment of the first electrode and the second electrode may be implemented; the two types of electrodes including the first electrode and the second electrode may be aligned through different methods which may avoid the alignment of the second electrode with the thin-film transistor, avoid the alignment of the first electrode with the command electrode, such that the second electrode and the first electrode may be more accurately aligned with the first end and the common electrode respectively. On the other hand, since the protrusion is embedded in the trench, the light-emitting device may be more stably arranged on the array layer through the nested structure, which may improve the structural stability of the display panel; and the match between the protrusion and the trench may prevent the protrusion from rotating relative to the trench, which may ensure that each first electrode correctly contact the corresponding thin-film transistor. On the other hand, the misalignment risk may be reduced, and one alignment of the protrusion and the trench may connect multiple light-emitting devices (e.g., three light-emitting devices in one embodiment) accordingly. Multiple light-emitting devices may only need one protrusion. When the light-emitting devices are arranged on the array layer, only the light-emitting devices with protrusions correctly entering into the trenches may be fixed on the array layer since the trenches are on the array layer and the protrusions are disposed on the light-emitting devices. In such way, the automatic assembly of the light-emitting devices may be implemented, there may not be required to align the light-emitting devices through the grabbing and alignment equipment, and also the alignment error may not occur due to the limited transport arrangement precision. Especially for high-resolution display requirement, it may not only save the space occupied by the alignment mark, but also reduce the fabrication process and the precision requirement of the alignment process for fabricating the high-density light-emitting devices.

In certain optional embodiments, the widths of the channel regions 221 of at least two of the thin-film transistors 200 in the same control unit may be different, and the width direction is the direction from the ring center toward the outside of the ring.

Figure 12:
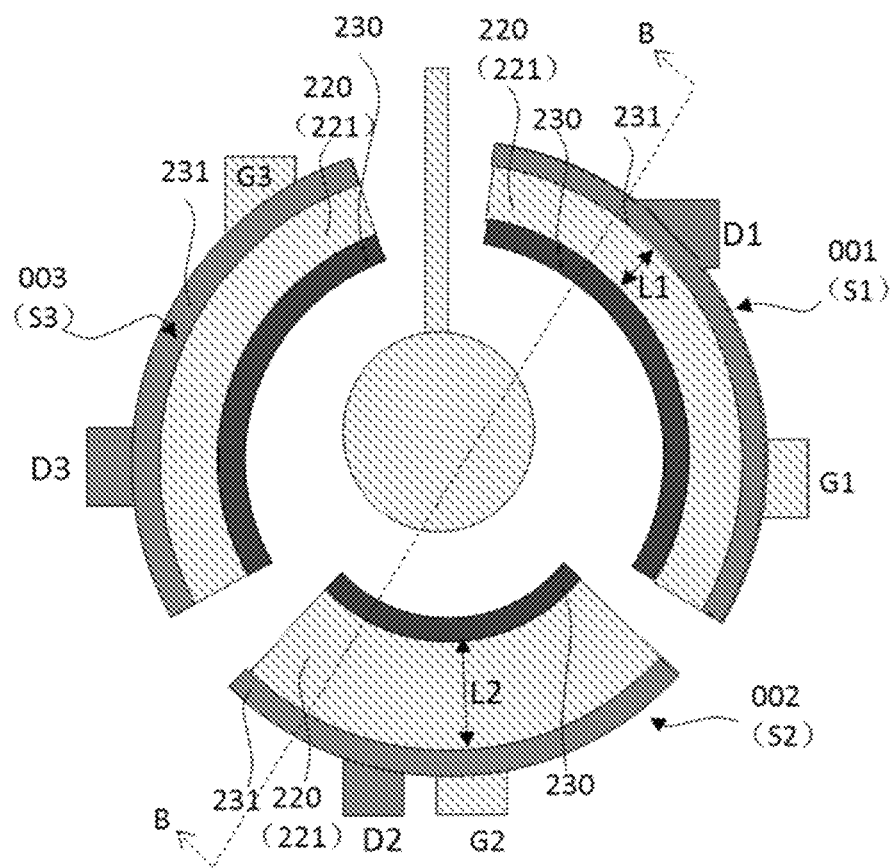
FIG. 12 illustrates a local top view of a control unit of another display panel according to exemplary embodiments of the present disclosure.
Figure 13:
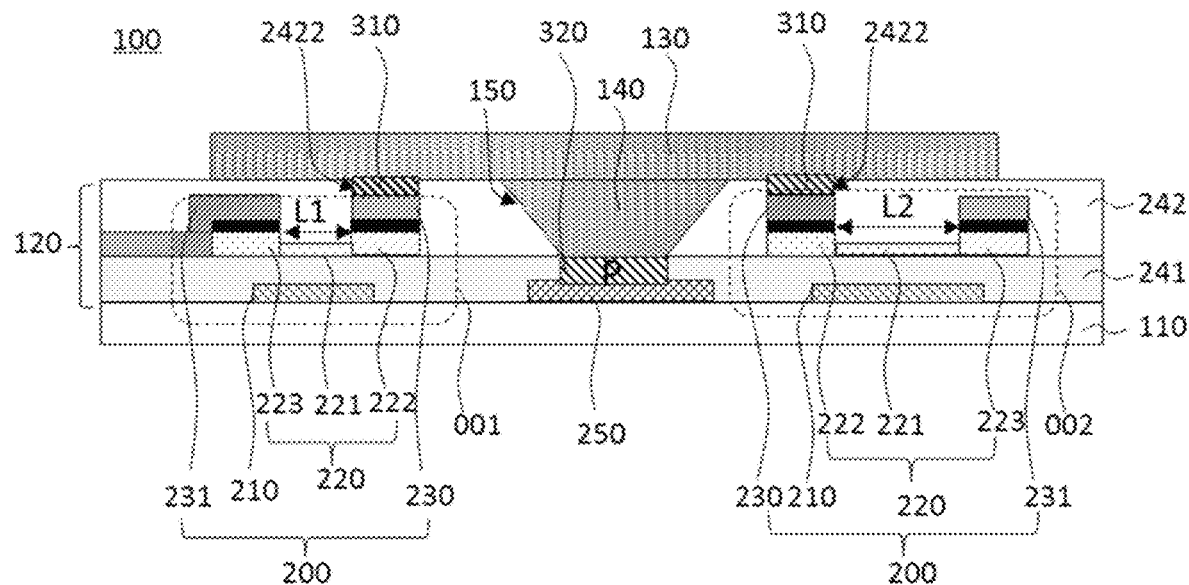
FIG. 13 illustrates a cross-sectional schematic of another display panel according to exemplary embodiments of the present disclosure.

For example, as shown in FIGS. 12-13, FIG. 12 illustrates a local top view of a control unit of another display panel according to exemplary embodiments of the present disclosure; and FIG. 13 illustrates a cross-sectional schematic of another display panel according to exemplary embodiments of the present disclosure, where the cross section is perpendicular to the plane of the display panel. The cross section of the control unit in FIG. 13 is equivalent to the cross section along the BB direction in FIG. 12. The gate electrode is blocked in FIG. 12, and only the gate wiring G1, G2, and G3 are shown.

A same control unit may include at least three thin-film transistors, which are the first thin-film transistor 001, the second thin-film transistor 002, and the third thin-film transistor 003. The first thin-film transistor 001, the second thin-film transistor 002, the third thin-film transistor 003 may be arranged by collectively surrounding a certain point to form the ring-shaped control unit.

The width L1 of the channel region 221 of the first thin-film transistor 001 may be less than the width L2 of the channel region 221 of the second thin-film transistor 002.

It should be noted that, in one embodiment, the channel regions 221 may also be formed in the ring-shaped arrangement along the extension path of the active layer 220, and the first ends 230 and the second ends 231 of the thin-film transistors 200 may be oppositely arranged along the direction perpendicular to the ring-shaped arrangement path. Therefore, the length direction of the channel region 221 may extend along the direction of the ring-shaped arrangement path of the active layer 220, and the width direction of the channel region 221 may be the direction perpendicular to the ring-shaped arrangement path, that is, the direction from the center of the ring to the outside of the ring. Taking the circular ring-shaped path for an example in one embodiment, the width direction of the channel region 221 at a certain point may be parallel with the radius or the direct extension direction of the radius of the circle passing the certain point.

Optionally, for the LED that requires a relatively large drive current, the channel width (W) of the TFT may be increased accordingly; for LED that requires a relatively small drive current, the channel width (W) may be appropriately reduced accordingly. Therefore, the drive current requirement of the light-emitting device corresponding to the first thin-film transistor 001 may be less than the drive current requirement of the light-emitting device corresponding to the second thin-film transistor 002.

In one embodiment, the channel widths of the thin-film transistors in each section of the control unit may be unequally configured according to the different drive capacities for different color LEDs. Meanwhile, due to the surrounding arrangement of the thin-film transistors, the changes in the widths of the channel regions of the thin-film transistors may less affect the pattern of the entire array layer.

Furthermore, in the same control unit, the second ends 231 of all thin-film transistors 200 may be arranged along the ring, and all second ends 231 may be on the same ring-shaped path, that is, the outer contour of the control unit may be on a same loop.

Optionally, the ring shape may be a circular ring. In such way, all the second ends 231 may have the same distance from the center of the circular ring.

Optionally, the distance from the first end 230 of the second thin-film transistor 002 to the center of the circular ring may be less than the distance from the first end 230 of the first thin-film transistor 001 to the center of the circular ring. In other words, the length of the channel region of the second thin-film transistor 002 extending from the outermost ring-shaped contour of the control unit toward the center of the ring may be longer than the length of the channel region of the first thin-film transistor 001 extending from the outermost ring-shaped contour of the control unit toward the center of the ring.

In one embodiment, on the one hand, for the case where the thin-film transistors with different drive performance need to be disposed in the same control unit, there is no need to concern with the increasing external expansion area and occupied area of the control unit caused by expanding the area of the channel region; since the ring-shaped control unit has two expansion directions, the control unit may be inwardly expanded to the ring without causing the outer contour of the control unit to change and without affecting the arrangement of other devices at the array layer. On the other hand, different control units may have different drive requirements for the light-emitting devices of the same color in the light-emitting unit in certain cases. In one embodiment, the widths of the channel regions of the thin-film transistors of the light-emitting devices of the same color in different control units may be independently adjusted, while ensuring that the size of each control unit remains the same, which may be beneficial for the uniform layout and structure of the array layer, and may avoid crosstalk caused by the different distances between adjacent control units. On the other hand, in one embodiment, after the distances between the first ends connected to the first electrodes accordingly and the center of the ring are different, the first electrodes and the first ends in a same group may have a certain alignment relationship, which may avoid misaligned connections between the first electrodes and the first ends of the same group.

In certain optional embodiments of the present application, at least one of the thin-film transistors 200 in the same control unit may include a plurality of sub-thin-film transistors which may be disposed side by side along the direction from the ring center toward the outside of the ring.

Figure 14:
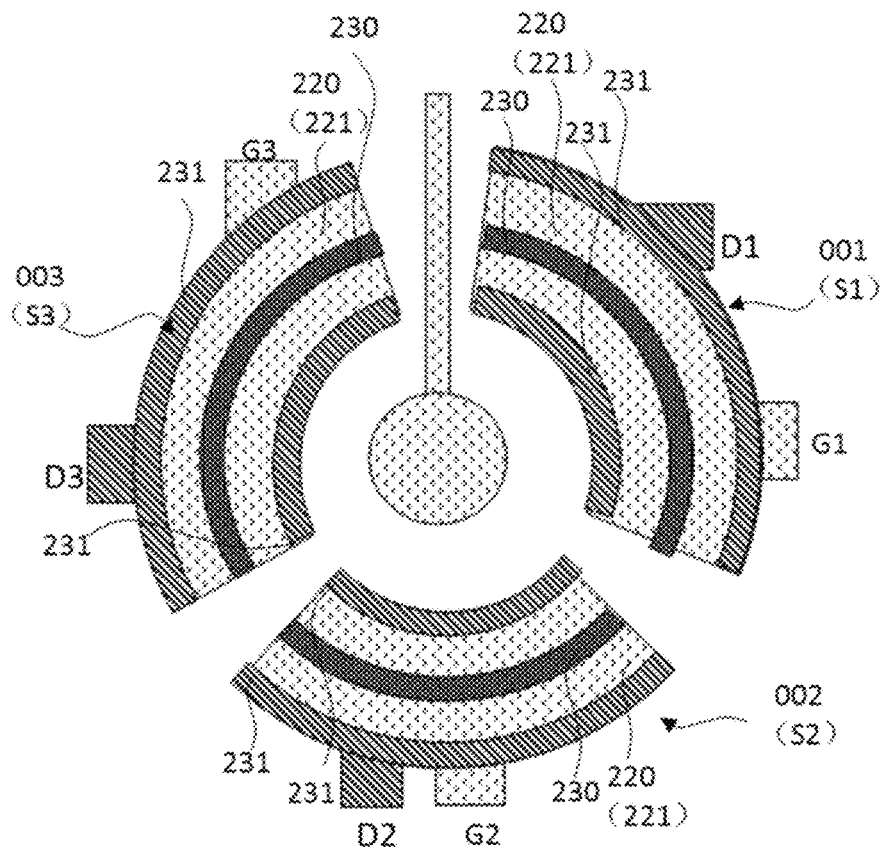
FIGS. 14-15 respectively illustrate local top views of control units of two other display panels according to exemplary embodiments of the present disclosure.
Figure 15:
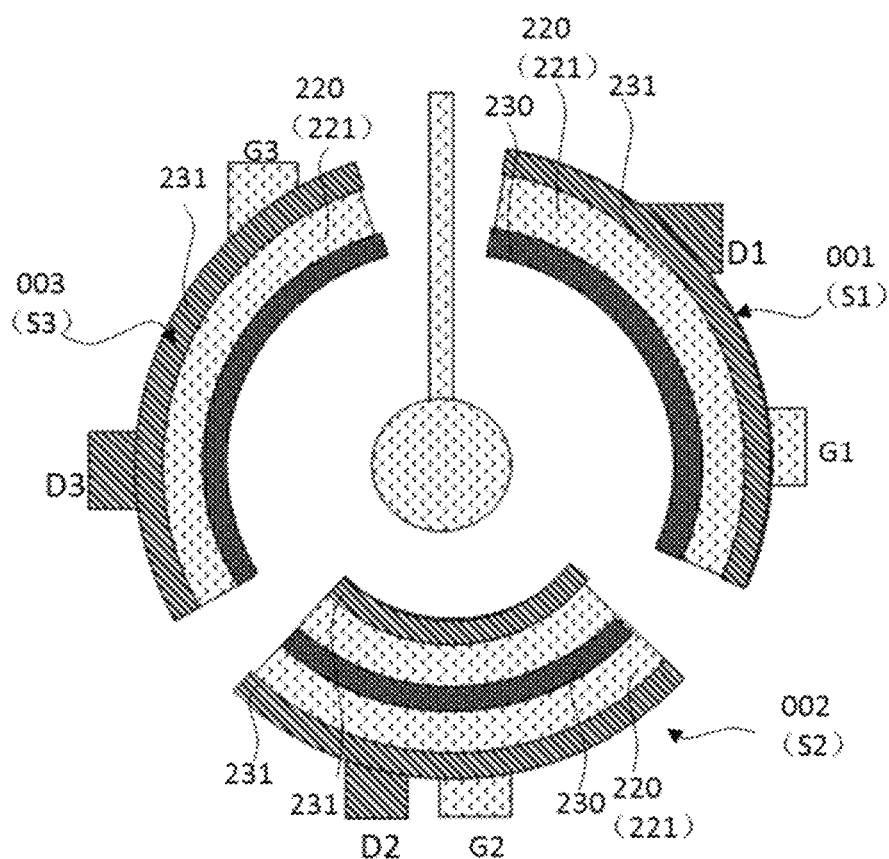

For example, as shown in FIGS. 14-15, FIGS. 14-15 respectively illustrate local top views of control units of two other display panels according to exemplary embodiments of the present disclosure.

The thin-film transistor 200 may include two second ends 231 and one first end 230; along the direction from the ring center toward the outside of the ring, the first end 230 may be between two second ends 231, and two sub-thin-film transistors may share one first end 230.

Obviously, in one embodiment, two thin-film transistors disposed side by side are taken as an example (i.e., two turns of the channel regions 221 as an example). In other optional embodiments of the present application, any number of sub-thin-film transistors may be disposed side by side along the direction from the ring center toward the outside of the ring. Along the direction from the ring center toward the outside of the ring, the first ends and the second ends may be alternately disposed, and adjacent sub-thin-film transistors in the same thin-film transistor may share the first end or the second end between two adjacent sub-thin-film transistors.

Furthermore, as shown in FIG. 15, the quantity of sub-thin-film transistors of the thin-film transistors in the same control unit may be different. For example, the first thin-film transistors 001 and the third thin-film transistors 003 may be formed by only one sub-thin-film transistors, and the second thin-film transistor may include two sub-thin-film transistors. Optionally, the outermost thin-film transistors of the first thin-film transistors 001, the third thin-film transistors 003 and the second thin-film transistors may be on a same ring shape. In other words, the outer contour of the control unit may be on a same loop and the outer portion of the ring shape may not expand; for the thin-film transistors that the sub-thin-film transistors need to be arranged side by side, the sub-thin-film transistors may be arranged to extend inwardly from the outer contour of the control unit.

In one embodiment, the sub-thin-film transistors may be unequally configured according to different drive capacities required for LEDs of different colors. Moreover, there is no need to concern with the increasing arrangement occupied area of the sub-thin-film transistors arranged side by side. The control unit may adjust the sizes of the channel regions for different light-emitting devices while the entire external contour of the control unit may not change.

Figure 16:
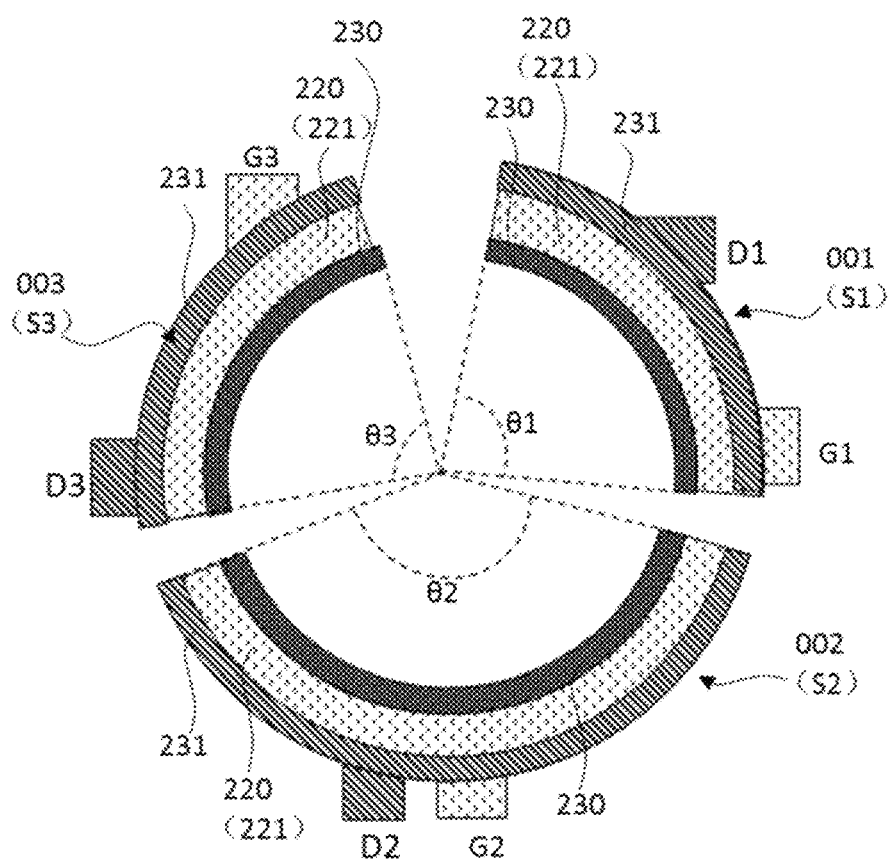
FIG. 16 illustrates a local top view of a control unit of another display panel according to exemplary embodiments of the present disclosure.

In certain optional embodiments of the present application, at least two of the thin-film transistors in the same control unit may have different channel lengths. For example, as shown in FIG. 16, FIG. 16 illustrates a local top view of a control unit of another display panel according to exemplary embodiments of the present disclosure.

A same control unit may include at least three thin-film transistors, which are respectively the first thin-film transistor 001, the second thin-film transistor 002, and the third thin-film transistor 003. The first thin-film transistor 001, the second thin-film transistor 002, and the third thin-film transistor 003 may be arranged around a certain point together to form the ring-shaped control unit.

The length of the channel region 221 of the first thin-film transistor 001 may be less than the length of the channel region 221 of the second thin-film transistor 002. Optionally, the first thin-film transistors 001 and the second thin-film transistors 002 may be disposed adjacent to each other. In such way, the first thin-film transistors 001 and the second thin-film transistors 002 may be on a same loop and may use each other's free space.

It should be noted that, in one embodiment, the channel regions 221 may also be formed in the ring-shaped arrangement along the extension path of the active layer 220, and the first end 230 and the second end 231 of the thin-film transistor 200 may be oppositely arranged along the direction perpendicular to the ring-shaped arrangement path. Therefore, the length direction of the channel region 221 may extend along the direction of the ring-shaped arrangement of the active layer 220.

Optionally, for the LED that requires a relatively large drive current, the channel length (L) of the TFT may be reduced accordingly; for LED that requires a relatively small drive current, the channel length (L) may be increased accordingly. Therefore, the drive current requirement of the light-emitting device corresponding to the first thin-film transistor 001 may be greater than the drive current requirement of the light-emitting device corresponding to the second thin-film transistor 002.

In one embodiment, the channel lengths of the thin-film transistors in each section of the control unit may be unequally configured according to the different drive capacities for different color LEDs. Meanwhile, due to the surrounding arrangement of the thin-film transistors, the changes in the lengths of the channel region of the thin-film transistors may less affect the pattern of the entire array layer.

Optionally, the above-mentioned ring shape may be a circular ring. In such way, all the channel regions 221 may form the arced shape of the circular ring.

Optionally, the central angle corresponding to the channel region 221 of the first thin-film transistor 001 may be a first central angle θ1, and the central angle corresponding to the channel region 221 of the second thin-film transistor 002 may be a second central angle θ2. The first center angle θ1 may be less than the second center angle θ2.

In one embodiment, for the case where the thin-film transistors with different drive performance need to be disposed in the same control unit, there is no need to concern with the increasing external expansion area and occupied area of the control unit caused by expanding the area of the channel region; the unequal division of the ring-shaped control unit may not cause the outer contour of the control unit to change and may not affect the arrangement of other devices at the array layer. In particular, the channel regions of certain thin-film transistors need to be lengthened and the channel regions of certain thin-film transistors need to be shortened in the same control unit; in one embodiment, the thin-film transistors are disposed along the ring, which enables the channel regions of all thin-film transistors to be on the same loop; and the channel region that needs to be shortened may be disposed adjacent to the channel region that needs to be lengthened. The unoccupied space, which is left by the channel region that needs to be shortened after shortening, may be utilized by the channel region that needs to be lengthened. The channel region that needs to be lengthened may only need to be extended along the trajectory of its length direction (e.g., the ring-shaped path of the channel region arrangement). In such way, it may avoid the mix-up of the thin-film transistor array structure in the array layer, where certain thin-film transistors may be lengthened, and certain thin-film transistors may be shortened.

On the other hand, different control units may have different drive requirements for the light-emitting devices of the same color in the light-emitting unit. In one embodiment, the widths of the channel regions of the thin-film transistors of the light-emitting devices of the same color in different control units may be independently adjusted, while ensuring that the size of each control unit remains the same, which may be beneficial for the uniform layout and structure of the array layer, and may avoid crosstalk caused by the different distances between adjacent control units.

On the other hand, in one embodiment, the arc lengths corresponding to the thin-film transistors which are connected to the first electrode accordingly are different, such that the first electrodes and the thin-film transistors in a same group may have certain alignment relationship, which may avoid misaligned connections between the first electrodes and the thin-film transistors in different groups.

In certain optional embodiments of the present application, at least two of the thin-film transistors in the same control unit may have different channel widths, and the width direction is the direction from the ring center toward the outside of the ring; at least two of the thin-film transistors in the same control unit may have different channel lengths, at least one of the thin-film transistors 200 in the same control unit may include a plurality of sub-thin-film transistors which may be disposed side by side along the direction from the ring center toward the outside of the ring. It should be noted that a certain structure is disposed along "the direction from the ring center toward the outside of the ring" in some contexts of the present application may indicate that the certain structure is arranged along a path parallel to the direction by passing through the structure.

Figure 17:
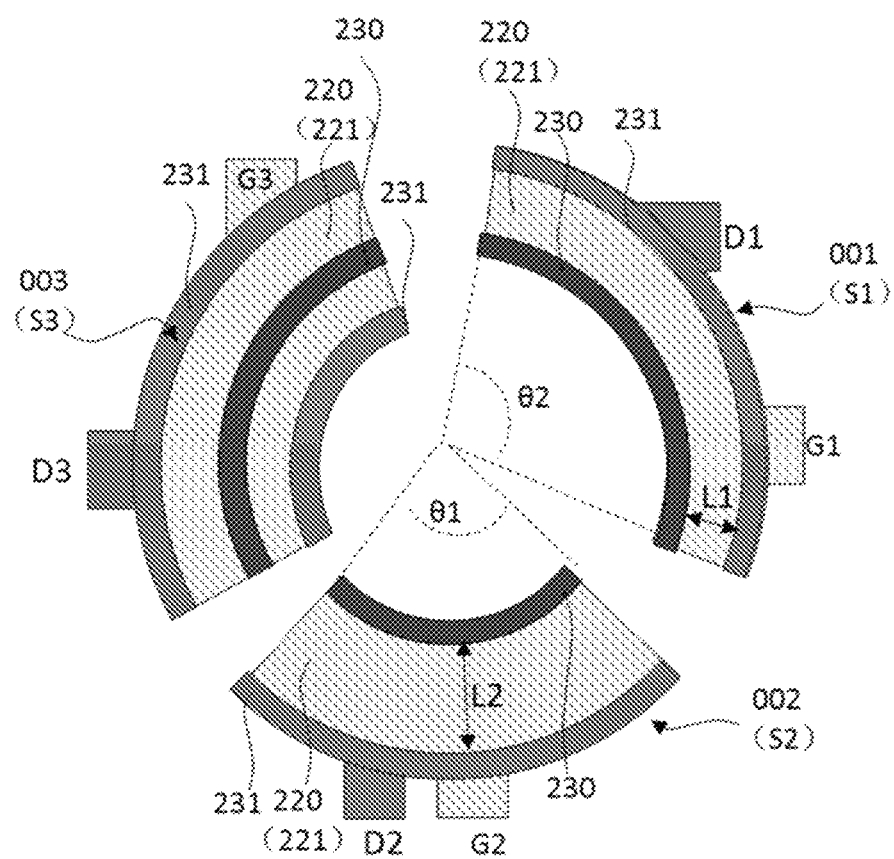
FIG. 17 illustrates a local top view of a control unit of another display panel according to exemplary embodiments of the present disclosure.

For example, as shown in FIG. 17, FIG. 17 illustrates a local top view of a control unit of another display panel according to exemplary embodiments of the present disclosure. The same control unit may include three thin-film transistors in one embodiment, which are respectively the first thin-film transistor 001, the second thin-film transistor 002, and the third thin-film transistor 003. The first thin-film transistor 001, the second thin-film transistor 002, and the third thin-film transistor 003 may be arranged around a certain point together to form the ring-shaped control unit.

The width L1 of the channel region 221 of the first thin-film transistor 001 may be less than the width L2 of the channel region 221 of the second thin-film transistor 002.

The width L1 of the channel region 221 of the first thin-film transistor 001 may be greater than the width L2 of the channel region 221 of the second thin-film transistor 002. That is, the central angle corresponding to the channel region 221 of the first thin-film transistor 001 may be the first central angle θ1, the central angle corresponding to the channel region 221 of the second thin-film transistor 002 may be the second central angle θ2, and the first center angle θ1 may be greater than the second center angle θ2.

The third thin-film transistor 003 may include two sub-thin-film transistors which may be disposed side by side along the direction from the ring center toward the outside of the ring. That is, the third thin-film transistor 003 may include two second ends 231 and one first end 230; along the direction from the ring center toward the outside of the ring, the first end 230 may be located between two second ends 231, and two sub-thin-film transistors may share one first end 230.

The similarities between the present embodiment and above-mentioned embodiments may not be described in detail herein, and the present embodiment may have functions and advantages of the above-mentioned embodiments.

With reference to the above-mentioned embodiments, the thin-film transistors in the same control unit may be arranged along the circular ring, and the channel regions of the thin-film transistors may be the arced shapes. It should be understood that the channels of the thin-film transistors may extend along the circular ring in its length direction, and the central angle of the arc may be the central angle of the circular ring.

By designing the arrangement path of the ring-shaped thin-film transistors as the circular ring, the arrangement of the thin-film transistors in the same control unit may be more compact, which may be beneficial for the alignment connection of the light-emitting devices in the LEDs and for the sharing of the common electrode. Furthermore, the cross-talk between the thin-film transistors in the same control unit may be controlled to be consistent, and it may avoid the cross-talk of the sandwiched thin-film transistors to be different from the cross-talk of the thin-film transistors at the edges in a straight line arrangement.

Figure 18:
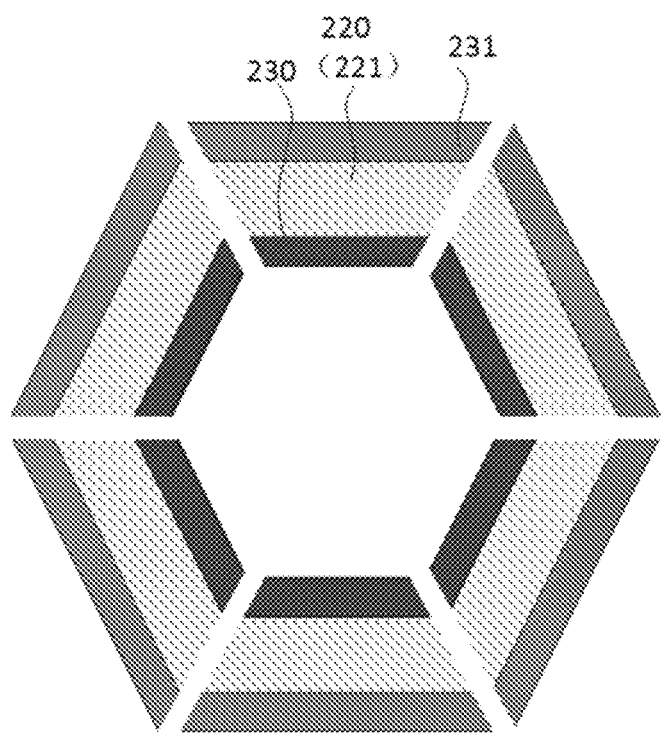
FIGS. 18-19 respectively illustrate local top views of control units of two other display panels according to exemplary embodiments of the present disclosure.

Obviously, in other optional embodiments of the present application, the structure of the ring-shaped path may also be the ring shape including other polygons. For example, as shown in FIGS. 18-19, FIGS. 18-19 illustrate local top views of control units of two other display panels according to exemplary embodiments of the present disclosure.

The control unit in the present application may be other polygonal shape including pentagon and hexagon. In other words, the ring-shaped path of the thin-film transistors may be a polygon, such as a regular polygon including a pentagon, a hexagon, and the like, or may be an irregular shape, such as a semi-circular ring, a fan-shaped ring, and the like.

Figure 19:
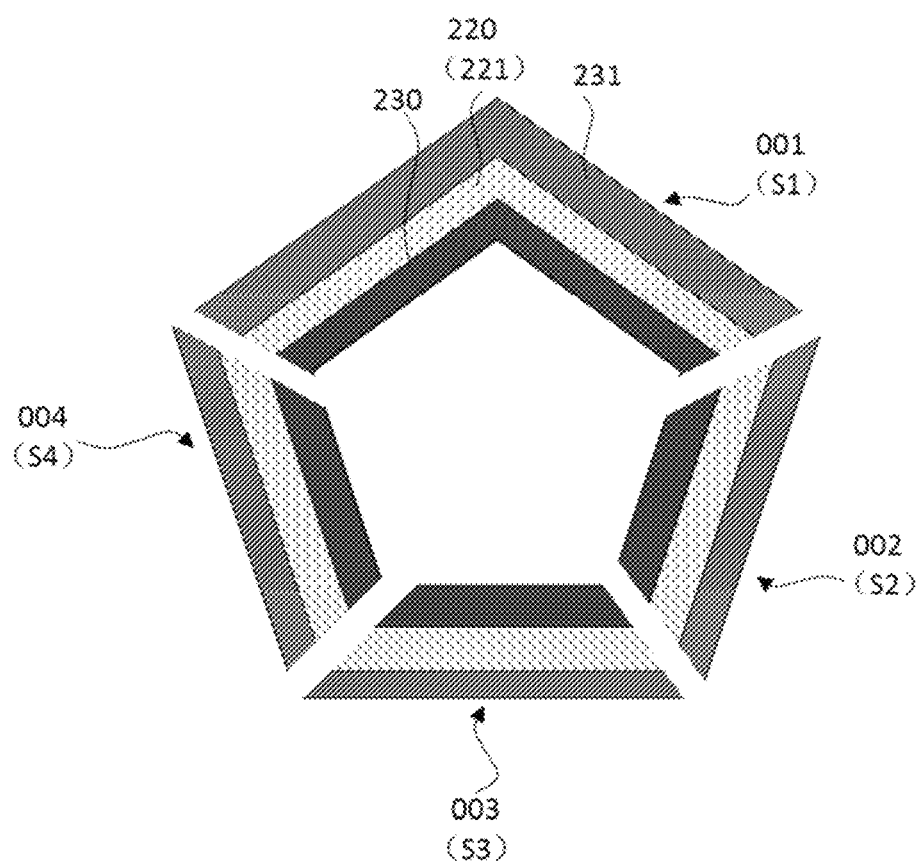

Furthermore, as shown in FIG. 19, the thin-film transistors in the same control unit may be arranged along the polygonal ring shape, where the channel region of at least one of the thin-film transistors may be a straight-line strip corresponding to the side of the polygon, and the channel region of at least one of the thin-film transistors may be a polyline strip corresponding to the angle of the polygon. For example, the thin-film transistors may be arranged along the pentagonal ring, and the extension path of the first thin-film transistor 001 may cover at least two sides of the pentagon and the angle between the two sides. The second thin-film transistor 002, the third thin-film transistor 003, and the fourth thin-film transistor 004 may respectively be on the remaining three sides of the pentagon. The first thin-film transistor 001, the second thin-film transistor 002, the third thin-film transistor 003, and the fourth thin-film transistor 004 may be arranged around a certain point together to form a pentagonal ring-shaped control unit. In such way, the channel region 221 of the first thin-film transistor 001 may correspond not only to two sides of the pentagon but also to the angle of the pentagon, such that the projection of the first thin-film transistor on the substrate may be formed in a polyline strip. The channel regions 221 of the second thin-film transistor 002, the third thin-film transistor 003, and the fourth thin-film transistor 004 may respectively correspond to the sides of the pentagon, such that the orthographic projections thereof on the substrate may be straight-line strips.

Optionally, in the same control unit, the drive current of the light-emitting device corresponding to the first thin-film transistor may be different from the drive currents of the light-emitting devices corresponding to other thin-film transistors.

In the same control unit, the drive capacity of the thin-film transistors with corners may be different from that of straight-line thin-film transistors. In one embodiment, based on different drive capacities required for different color LEDs, the shape characteristics of the polygonal ring-shaped path including the straight-light portion and the angled portion may be utilized to improve the drive capability of different color LEDs in the same control unit.

Figure 20:
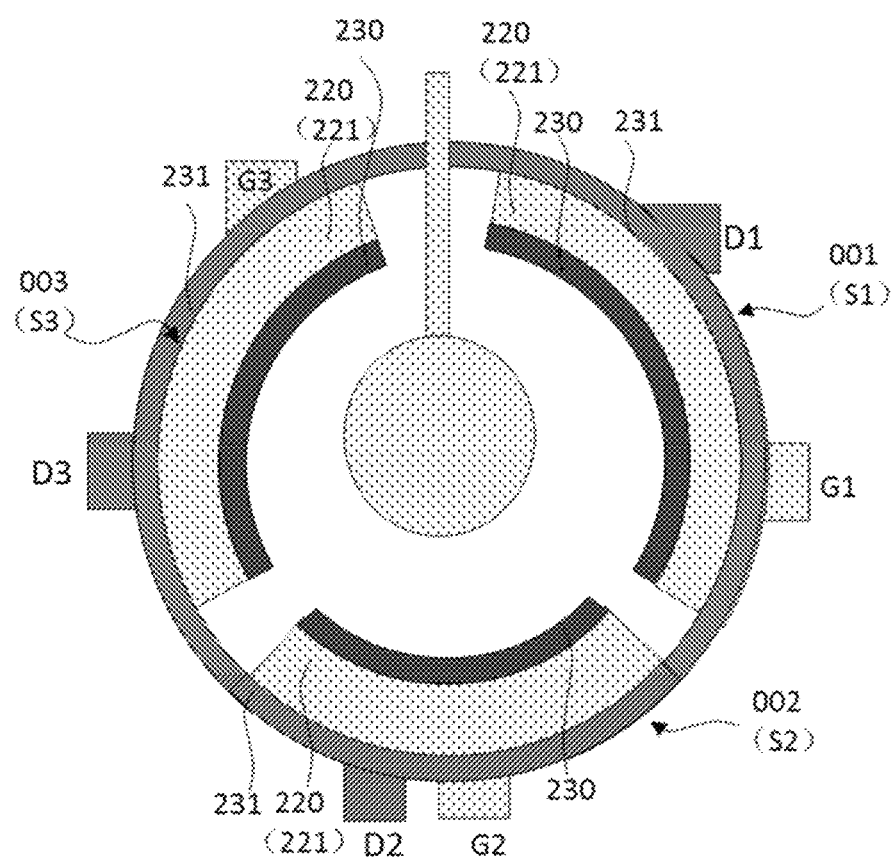
FIG. 20 illustrates a local top view of a control unit of another display panel according to exemplary embodiments of the present disclosure.

In certain optional embodiments of the present application, the source electrodes or the drain electrodes of the plurality of the thin-film transistors in the same control unit may be connected in a closed ring. For example, as shown in FIG. 20, FIG. 20 illustrates a local top view of a control unit of another display panel according to exemplary embodiments of the present disclosure. The second ends 231 (the source electrodes or the drain electrodes) of all thin-film transistors 200 in the same control unit are connected in the closed ring. Obviously, in other optional embodiments of the present application, not all of the second ends 231 (the source electrodes or the drain electrodes) of all thin-film transistors 200 in the same control unit are connected in the closed ring. Optionally, the second ends 231 (the source electrodes or the drain electrodes) of at least two thin-film transistors 200 in the same control unit may be connected in the non-closed ring.

In one embodiment, for the thin-film transistors that need to be connected, the ring-shaped arrangement may be beneficial for connecting the source electrodes or the drain electrodes of different thin-film transistors. The source electrodes or drain electrodes may only need to extend along the original extension direction to adjacent source electrodes or drain electrodes, such that the source electrodes or drain electrodes are connected to the adjacent source electrodes or drain electrodes, which may save the space required for disposing an additional connection portion and may not change the external contour of the control unit.

Figure 21:
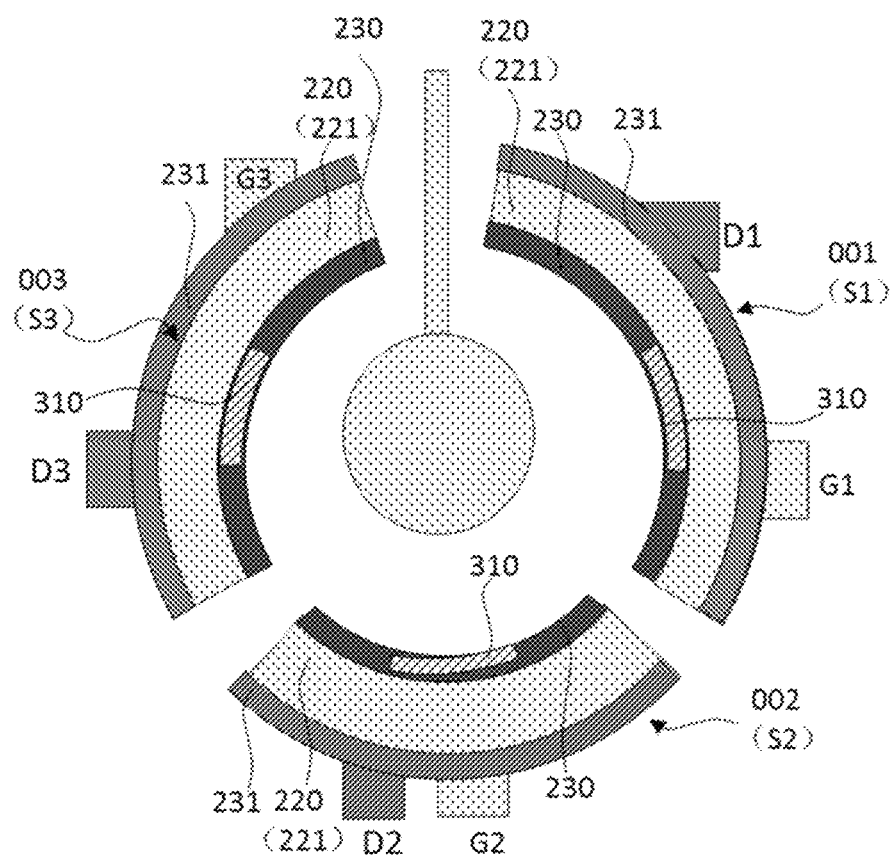
FIG. 21 illustrates a top view of a light-emitting unit of another display panel according to exemplary embodiments of the present disclosure.

In certain optional embodiments of the present application, as shown in FIG. 21, FIG. 21 illustrates a top view of a light-emitting unit of another display panel according to exemplary embodiments of the present disclosure. The area of the first electrode 310 in the same light-emitting unit may be smaller than the area of the source electrode or drain electrode of the corresponding thin-film transistor. That is, the area of the first electrode 310 in the same light-emitting unit may be smaller than the area of the first end 230 of the corresponding thin-film transistor.

Figure 22:
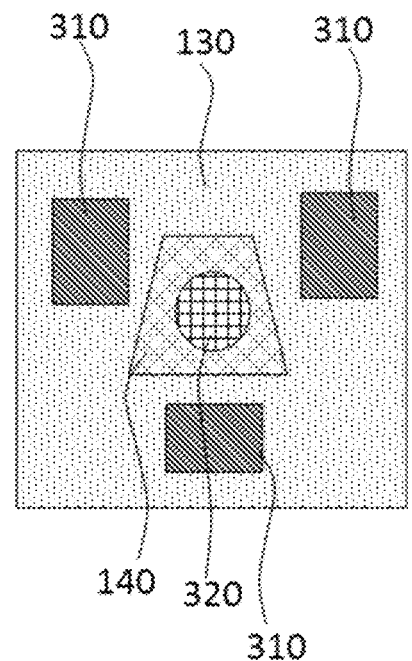
FIG. 22 illustrates a top view of a light-emitting unit of another display panel according to exemplary embodiments of the present disclosure.

Optionally, as shown in FIG. 22, FIG. 22 illustrates a top view of a light-emitting unit of another display panel according to exemplary embodiments of the present disclosure. The first electrode 310 may has a shape including a square, a rounded square, or an approximately square. It should be noted that the approximation in one embodiment may indicate that the pattern formed by a deviation or an error may not be a standard pattern, including for example a standard square. Optionally, the square may be a quadrilateral such as a square, a diamond, a rectangle, a parallelogram, and the like. The rounded square may be a quadrilateral such as a rounded square, a rounded rhombus, a rounded rectangle, a rounded parallelogram, and the like.

In the final alignment of the light-emitting unit and the control unit, the light-emitting unit and the control unit may be accurately aligned only when the projections of the first end and the first electrode at the same group on the substrate overlap with each other, and the projections of the first end and the first electrode at different groups on the substrate do not overlap with each other. In one embodiment, the area of the first electrode is smaller than the area of the first end. Even if there is a slight alignment deviation and the protrusion slightly rotates relative to the trench, the projection of the first electrode may still fall within the projection of the corresponding first end, which may reduce the possibility of misalignment when the light-emitting unit and the control unit are connected and aligned.

Figure 23:
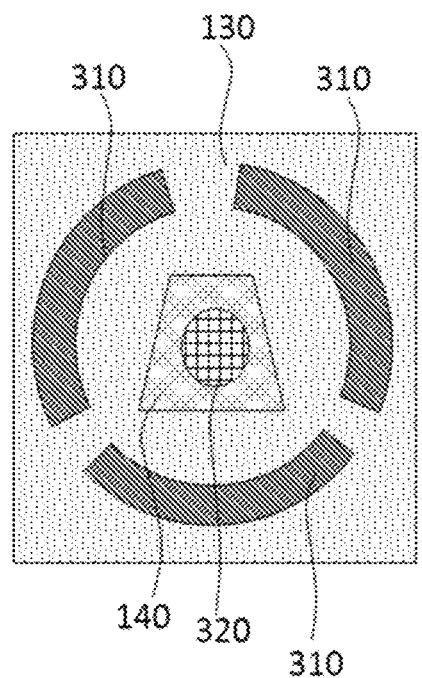
FIG. 23 illustrates a top view of a light-emitting unit of another display panel according to exemplary embodiments of the present disclosure.

In some optional embodiments of the present application, as shown in FIG. 11 or FIG. 23, FIG. 23 illustrates a top view of a light-emitting unit of another display panel according to exemplary embodiments of the present disclosure. The light-emitting unit 130 may be a shape including a square, a rounded square, or an approximately square. It should be noted that the approximation in one embodiment may indicate that the pattern caused by a deviation or an error may not be a standard direction. Optionally, the square may be a quadrilateral such as a square, a diamond, a rectangle, a parallelogram, and the like. The rounded square may be a quadrilateral such as a rounded square, a rounded rhombus, a rounded rectangle, a rounded parallelogram, and the like.

In one embodiment, the material may be saved the most; for the entire substrate for manufacturing the light-emitting units, the plurality of light-emitting units may be fabricated on the substrate, and the squared light-emitting units may be densely arranged to improve substrate utilization rate. Moreover, when aligning the squared light-emitting units to the array layer, the orientation may be suitably determined according to the sides and angles of the squares to improve the alignment accuracy. In addition, the squared light-emitting units may be uniformly arranged on the array layer.

Figure 24:
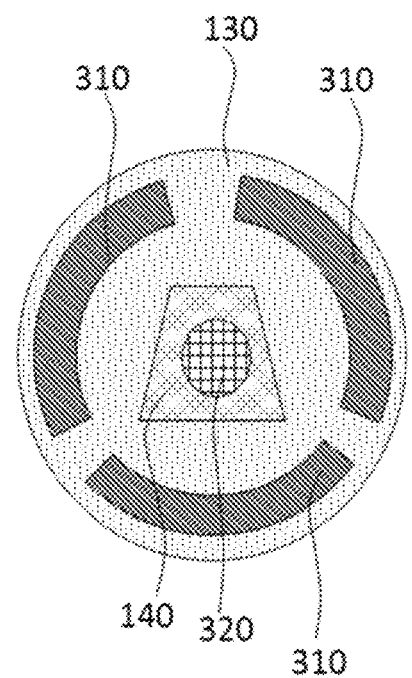
FIG. 24 illustrates a top view of a light-emitting unit of another display panel according to exemplary embodiments of the present disclosure.

Obviously, in other optional embodiments of the present application, the encapsulation shape may also be customized according to requirements. As shown in FIG. 24, FIG. 24 illustrates a top view of a light-emitting unit of another display panel according to exemplary embodiments of the present disclosure. The light-emitting unit 130 may be a circle. Optionally, the arrangement path of the first electrodes may also be a circular ring. In such way, the arrangement path of the first electrodes may be consistent with the contour shape of the light-emitting unit.

Figure 25:
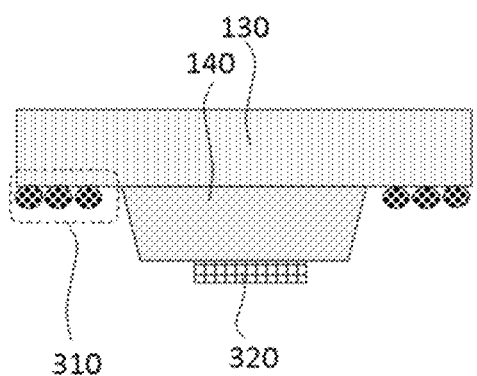
FIG. 25 illustrates a structural schematic of a light-emitting unit of another display panel according to exemplary embodiments of the present disclosure.

In certain optional embodiments, the LED electrodes (the first electrodes) may not need to completely cover the source electrodes (the first ends), as long as the contact conduction is ensured. In certain optional embodiments of the present application, the LED contact pad (the first electrode) may be a flat-plate electrode or a spherical solder pin. As shown in FIG. 25, FIG. 25 illustrates a structural schematic of a light-emitting unit of another display panel according to exemplary embodiments of the present disclosure. The first electrode 310 of the light-emitting unit 130 may be a spherical solder pin, which may better match the ring shape. Especially, for the case where the first electrode also extends along the ring-shaped path, the first electrode may be better contacted with the first end to improve the alignment accuracy. Furthermore, in the present application, the shapes of the first electrode of the light-emitting device and the first end of the thin-film transistor may be substantially same, the light-emitting device may overlap and be contact with the thin-film transistor, and the spherical solder pin may be selected suitably. It does not need to be limited to select other conductive film layers need to be patterned to connect the first electrode with the first end.

Figure 26:
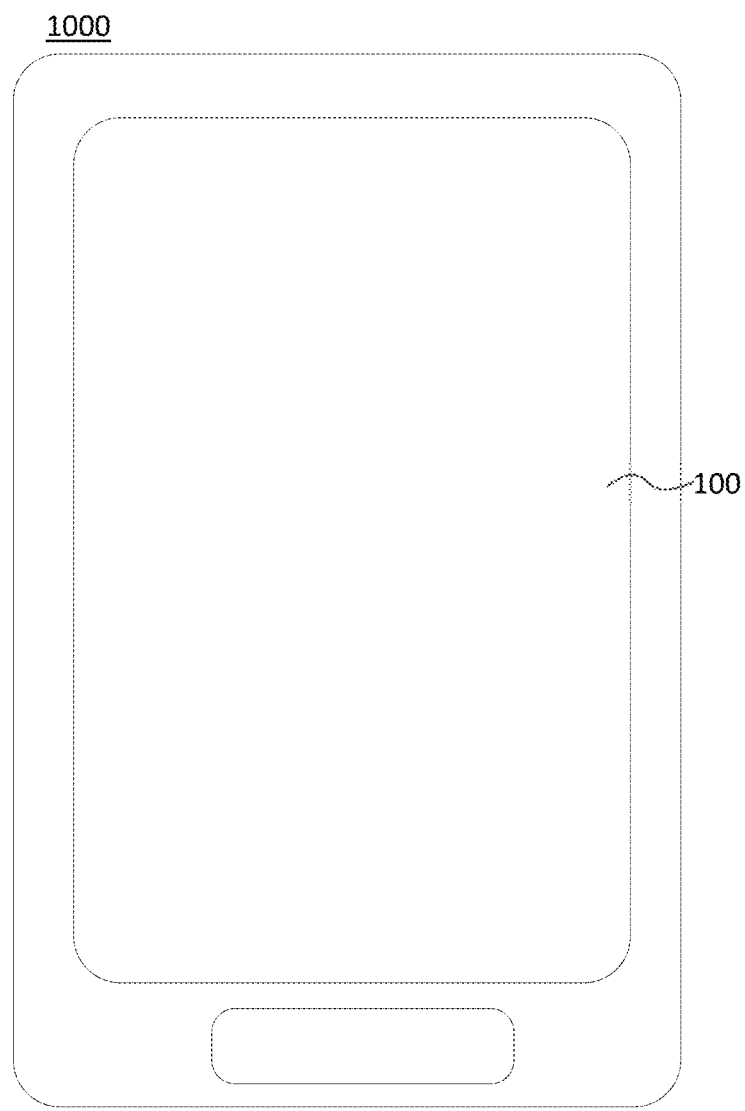
FIG. 26 illustrates a structural schematic of a display device according to exemplary embodiments of the present disclosure.

The present disclosure also provides a display device, including any display panel provided by the present disclosure. As shown in FIG. 26, FIG. 26 illustrates a structural schematic of a display device according to exemplary embodiments of the present disclosure. A display device 1000 may include a display panel 100 provided by any one of the above-mentioned embodiments of the present disclosure. The embodiment shown in FIG. 26 may merely use a mobile phone as an example to describe the display device 1000. It should be understood that the display device provided by the embodiments of the present disclosure may be a display device with a display function such as a computer, a TV, a car display device, and the like, which may not be limited according to the embodiments of the present disclosure. The display device provided by the embodiments of the present disclosure may have the beneficial effects of the display panel provided by the embodiments of the present disclosure. For details, reference may be made to the specific description of the display panel in the above-mentioned embodiments of the present disclosure, which may not be described in detail herein.

From the above-mentioned embodiments, it can be seen that the display panel and the display device provided by the present disclosure may achieve at least the following beneficial effects.

In the present disclosure, the space occupied by the pixel composed of the group of the light-emitting devices and the thin-film transistors corresponding to the light-emitting devices may be reduced, and more pixels may be disposed for the display panel with the same area, which may be beneficial for the display effect of the pixels and for improving the display resolution and the transport efficiency.

Further detailed description of the present disclosure in conjunction with specific preferred embodiments may be described above, and it may not be assumed that the specific implementation of the present disclosure is limited to such descriptions. Without departing from the concept of the present disclosure, those skilled in the art in the technical field of the present disclosure may make certain simple deductions or replacements, which should be regarded as falling within the protection scope of the present disclosure.

What is claimed is:

1. A display panel, comprising:
a substrate;
an array layer on the substrate, wherein the array layer includes a plurality of control units, one control unit includes a plurality of thin-film transistors, and the plurality of thin-film transistors in a same control unit are sequentially arranged along a ring-shaped path and separated from each other by a spacing between adjacent thin-film transistors of the plurality of thin-film transistors; and
a plurality of light-emitting units on a side of the array layer away from the substrate, wherein:
the plurality of light-emitting units and the plurality of control units are in a one-to-one correspondence;
a light-emitting unit includes a plurality of light-emitting devices each having a first electrode;
a plurality of first electrodes in a same light-emitting unit are sequentially arranged along an arrangement direction of the plurality of thin-film transistors in a control unit corresponding to the same light-emitting unit; and
the plurality of first electrodes are electrically connected to the plurality of thin-film transistors.

2. The display panel according to claim 1, wherein:
the light-emitting unit is a composite micro light-emitting diode.

3. The display panel according to claim 1, wherein:
a length direction of a channel region of a thin-film transistor extends along the arrangement direction of the plurality of thin-film transistors.

4. The display panel according to claim 1, wherein:
a light-emitting device further includes a second electrode;
the second electrode and the first electrode are at a same side of the light-emitting unit; and
in the same light-emitting unit, the plurality of light-emitting devices shares the second electrode, and the plurality of first electrodes are arranged surrounding the second electrode.

5. The display panel according to claim 4, wherein:
the array layer further includes a common electrode electrically connected to the second electrode; and
in the same control unit, the plurality of thin-film transistors are arranged surrounding the common electrode.

6. A display panel, comprising:
a substrate;
an array layer on the substrate, wherein the array layer includes a plurality of control units, one control unit includes a plurality of thin-film transistors, and the plurality of thin-film transistors in a same control unit are sequentially arranged along a ring-shaped path; and
a plurality of light-emitting units on a side of the array layer away from the substrate, wherein:
the plurality of light-emitting units and the plurality of control units are in a one-to-one correspondence;
a light-emitting unit includes a plurality of light-emitting devices each having a first electrode;
a plurality of first electrodes in a same light-emitting unit is sequentially arranged along an arrangement direction of the plurality of thin-film transistors in a control unit corresponding to the same light-emitting unit;
the plurality of first electrodes are electrically connected to the plurality of thin-film transistors;
a light-emitting device further includes a second electrode;
the second electrode and the first electrode are at a same side of the light-emitting unit;
in the same light-emitting unit, the plurality of light-emitting devices share the second electrode, and the plurality of first electrodes are arranged surrounding the second electrode;

the array layer further includes a common electrode electrically connected to the second electrode;

in the same control unit, the plurality of thin-film transistors are arranged surrounding the common electrode;

the array layer further includes a common electrode line disposed at a same layer as the common electrode;

the common electrode and gate electrodes of the plurality of thin-film transistor are made of a same material in a same layer; and the common electrode line is electrically connected to the common electrode through a spacing between the plurality of thin-film transistors.

7. The display panel according to claim 1, wherein:
a light-emitting device further includes a second electrode;
the second electrode and the first electrode are at different sides of the light-emitting unit; and
in the same light-emitting unit, the plurality of light-emitting devices shares the second electrode.

8. The display panel according to claim 1, wherein:
the light-emitting unit further includes a protrusion protruding toward the substrate, and the plurality of first electrodes surrounds the protrusion;
an insulation layer in the array layer includes a trench accommodating the protrusion, and the plurality of thin-film transistors surrounds the trench; and
the protrusion and the trench are matched with each other in shape.

9. The display panel according to claim 8, wherein:
a light-emitting device further includes a second electrode;
the second electrode and the first electrode are at a same side of the light-emitting unit;
in the same light-emitting unit, the plurality of light-emitting devices shares the second electrode, and the plurality of first electrodes are arranged surrounding the second electrode;
the array layer further includes a common electrode electrically connected to the second electrode;
in the same control unit, the plurality of thin-film transistors are arranged surrounding the common electrode; and
when the second electrode and the first electrode are at the same side of the light-emitting unit, the second electrode is on the protrusion and the trench exposes the common electrode.

10. The display panel according to claim 1, wherein:
the protrusion is a non-rotatable body.

11. The display panel according to claim 1, wherein:
at least one of the plurality of thin-film transistors in the same control unit includes a plurality of sub-thin-film transistors which are disposed side by side along a direction from a ring center toward an outside of a ring.

12. The display panel according to claim 1, wherein:
at least two of the plurality of thin-film transistors in the same control unit have different widths of channel regions in a direction from a ring center toward an outside of the ring.

13. The display panel according to claim 1, wherein:
at least two of the plurality of thin-film transistors in the same control unit have different channel lengths.

14. The display panel according to claim 1, wherein:
the plurality of thin-film transistors in the same control unit are arranged along a circular ring, and a channel region of a thin-film transistor is arc shaped.

15. The display panel according to claim 1, wherein:
an area of a first electrode in the same light-emitting unit is smaller than an area of a source electrode or a drain electrode of a corresponding thin-film transistor in the same light-emitting unit.

16. The display panel according to claim 1, wherein:
the plurality of thin-film transistors in the same control unit are arranged along a polygonal ring, wherein:
a channel region of at least one of the plurality of thin-film transistors is a straight-line strip corresponding to a side of a polygon; and
a channel region of at least one of the plurality of thin-film transistors is a polyline strip corresponding to an angle of the polygon.

17. The display panel according to claim 1, wherein:
source electrodes or drain electrodes of at least two of the plurality of thin-film transistors in the same control unit are connected with each other along the ring-shaped path to form a closed ring or a non-closed ring.

18. The display panel according to claim 1, wherein:
the first electrode is a spherical solder pin.

19. The display panel according to claim 1, wherein:
the light-emitting unit has a shape including a square, a rounded square, or an approximate square.

20. A display device, comprising:
a display panel, comprising:
a substrate;
an array layer on the substrate, wherein the array layer includes a plurality of control units, one control unit includes a plurality of thin-film transistors, and the plurality of thin-film transistors in a same control unit are sequentially arranged along a ring-shaped path and separated from each other by a spacing between adjacent thin-film transistors of the plurality of thin-film transistors; and
a plurality of light-emitting units on a side of the array layer away from the substrate, wherein:
the plurality of light-emitting units and the plurality of control units are in a one-to-one correspondence;
a light-emitting unit includes a plurality of light-emitting devices each having a first electrode;
a plurality of first electrodes in a same light-emitting unit are sequentially arranged along an arrangement direction of the plurality of thin-film transistors in a control unit corresponding to the same light-emitting unit; and
the plurality of first electrodes are electrically connected to the plurality of thin-film transistors in a one-to-one correspondence.

* * * * *